(12) United States Patent
Kim et al.

(10) Patent No.: US 12,250,807 B2
(45) Date of Patent: Mar. 11, 2025

(54) SEMICONDUCTOR DEVICE USING DIFFERENT TYPES OF THROUGH-SILICON-VIAS

(71) Applicant: SAMSUNG ELECTRONICS CO., LTD., Suwon-si (KR)

(72) Inventors: Jaesan Kim, Suwon-si (KR); Seunghan Woo, Seoul (KR); Haesuk Lee, Seongnam-si (KR); Youngcheon Kwon, Hwaseong-si (KR); Reum Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/496,498

(22) Filed: Oct. 7, 2021

(65) Prior Publication Data
US 2022/0130841 A1  Apr. 28, 2022

(30) Foreign Application Priority Data
Oct. 23, 2020 (KR) .................. 10-2020-0138654

(51) Int. Cl.
*H10B 12/00* (2023.01)
*H01L 23/48* (2006.01)
*H01L 23/528* (2006.01)
*H01L 29/8605* (2006.01)
*H01L 29/94* (2006.01)

(52) U.S. Cl.
CPC .......... *H10B 12/50* (2023.02); *H01L 23/481* (2013.01); *H01L 23/5286* (2013.01); *H01L 29/8605* (2013.01); *H01L 29/94* (2013.01); *H10B 12/30* (2023.02)

(58) Field of Classification Search
CPC ....... H10B 12/50; H10B 12/30; H01L 23/481; H01L 23/5286; H01L 29/8605; H01L 29/94
See application file for complete search history.

(56) References Cited

U.S. PATENT DOCUMENTS

| 2010/0171226 | A1* | 7/2010 | West | H01L 23/481 |
| | | | | 257/774 |
| 2011/0095367 | A1 | 4/2011 | Su et al. | |
| 2013/0249011 | A1* | 9/2013 | Choi | H01L 21/823807 |
| | | | | 257/369 |

(Continued)

FOREIGN PATENT DOCUMENTS

KR  10-2114340  5/2020

*Primary Examiner* — Zandra V Smith
*Assistant Examiner* — Scott E Bauman
(74) *Attorney, Agent, or Firm* — F. Chau & Associates, LLC

(57) ABSTRACT

A semiconductor device includes a semiconductor structure including a semiconductor substrate having an active zone with a channel; a through silicon via (TSV) structure including a power TSV configured to transmit power and a signal TSV configured to transmit a signal; and a keep-out zone located a predetermined distance away from the TSV structure and bounded by the active zone. The TSV structure penetrates the semiconductor substrate. The keep-out zone includes a first element area a first distance away from the power TSV, and a second element area a second distance away from the signal TSV.

18 Claims, 14 Drawing Sheets

(56) References Cited

U.S. PATENT DOCUMENTS

| | | | |
|---|---|---|---|
| 2013/0258792 A1* | 10/2013 | Kitano | G11C 5/06 |
| | | | 257/296 |
| 2014/0054742 A1* | 2/2014 | Katti | H01L 23/5223 |
| | | | 257/503 |
| 2014/0073133 A1* | 3/2014 | Kahn | H01L 25/0657 |
| | | | 438/667 |
| 2014/0091478 A1* | 4/2014 | Furuta | H01L 23/481 |
| | | | 257/774 |
| 2014/0264593 A1 | 9/2014 | Lin et al. | |
| 2015/0028450 A1* | 1/2015 | Park | H01L 21/76898 |
| | | | 257/532 |
| 2015/0097185 A1 | 4/2015 | Bae | |
| 2015/0115982 A1 | 4/2015 | Chen et al. | |
| 2015/0270230 A1* | 9/2015 | Hsieh | H01L 23/562 |
| | | | 438/667 |
| 2017/0141183 A1* | 5/2017 | Kim | H01L 23/5223 |
| 2017/0317160 A1 | 11/2017 | Kim | |
| 2020/0027521 A1* | 1/2020 | Choi | H10B 69/00 |
| 2020/0044669 A1* | 2/2020 | Cha | H03M 13/2906 |
| 2022/0037307 A1* | 2/2022 | Lee | H01L 23/481 |
| 2022/0310485 A1* | 9/2022 | Hwang | H01L 21/76898 |

\* cited by examiner

SEMICONDUCTOR DEVICE USING DIFFERENT TYPES OF THROUGH-SILICON-VIAS

CROSS-REFERENCE TO RELATED APPLICATION

This U.S. non-provisional patent application claims the benefit of priority under 35 U.S.C. § 119 to Korean Patent Application No. 10-2020-0138654, filed on Oct. 23, 2020, in the Korean Intellectual Property Office, the disclosure of which is incorporated by reference in its entirety herein.

TECHNICAL FIELD

The inventive concept relates to a semiconductor device, and more particularly, to a semiconductor device using different types of through-silicon-vias (TSVs).

DISCUSSION OF RELATED ART

As the amount of data to be processed by electronic devices increases, a memory device having a high capacity and high bandwidth is required. TSV technology is used to achieve highly integrated semiconductor devices. TSV technology is a packaging technology that connects the upper and lower ends of a semiconductor chip with through-silicon electrodes by drilling fine holes in the semiconductor chip.

TSV technology has advantages in speed and power consumption compared to wire bonding technology. Thermal stress of the TSV causes a decrease in electrical characteristics such as performance degradation of the transistors around the TSV. A semiconductor device may be manufactured with a keep out zone near the TSC that excludes circuits and wiring to reduce thermal stress.

However, as the spacing between TSVs gradually decreases in response to a demand for an increase in integration degree, the relative ratio of the keep-out zones increases, causing spatial overhead.

SUMMARY

At least one embodiment of the inventive concept increases space efficiency by utilizing the keep-out zone.

A semiconductor device according to an exemplary embodiment of the inventive concept includes a semiconductor structure including a semiconductor substrate including an active zone having a channel; a through silicon via (TSV) structure including a power TSV configured to transmit power and a signal TSV configured to transmit a signal; and a keep-out zone located a predetermined distance away from the TSV structure and bounded by the active zone to prevent deterioration of electrical characteristics. The TSV structure penetrates the semiconductor substrate. The keep-out zone includes a first element area located a first distance away from the power TSV, and a second element area located a second distance away from the signal TSV.

A semiconductor device according an exemplary embodiment of the inventive concept includes a semiconductor substrate; a through silicon via (TSV) structure configured to penetrate the semiconductor substrate; a first metal layer connected to an upper portion of the TSV structure and configured to supply power or a signal; an active zone included in the semiconductor substrate and including a channel; a keep-out zone perpendicular to a direction in which the TSV structure is formed and bordering from the TSV structure to the active zone; and an element area included in the keep-out zone. The element area includes a resistance element or a power storage element. The element area is spaced apart from the TSV structure by a predetermined distance. The element area has a different separation distance from the TSV structure depending on the power or the signal supplied to the TSV structure.

A semiconductor device according to an exemplary embodiment of the inventive concept includes a memory cell array including memory cells formed at intersections of a plurality of word lines and a plurality of bit lines; a peripheral circuit providing a plurality of signals for accessing the memory cell; a through silicon via (TSV) area including a power TSV configured to transmit power, and a signal TSV configured to transmit a signal; and a keep-out zone located a predetermined distance away from the TSV structure by a predetermined distance and bounded by the active zone to prevent deterioration of electrical characteristics. The keep-out zone includes a first element area located a first distance away from the power TSV, and a second element area located a second distance away from the signal TSV. The second distance is shorter than the first distance.

A semiconductor device according to an exemplary embodiment of the inventive concept includes a semiconductor structure, a through silicon via (TSV) structure, and a keep-out zone. The semiconductor structure includes a semiconductor substrate with an active zone having a channel. The TSV structure penetrates the semiconductor substrate. The keep-out zone is located a predetermined distance away from the TSV structure and bounded by the active zone. The keep-out zone includes an element area having a semiconductor element. The semiconductor element is located a first distance away from the TSV structure when the semiconductor element is a resistance element. The semiconductor element is located a second distance away from the TSV structure when the semiconductor element is a power storage element.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXAMPLE EMBODIMENTS

Hereinafter, example embodiments of the inventive concept will be described in detail with reference to the accompanying drawings.

Hereinafter, for convenience of description, a memory cell, a memory device, or a memory chip is exemplified, but the technical idea of the inventive concept is not limited thereto. It should be understood that the technical idea of the inventive concept may be applied to all semiconductor devices using semiconductor elements such as volatile memory, nonvolatile memory, and non-memory semiconductor.

Figure 1:
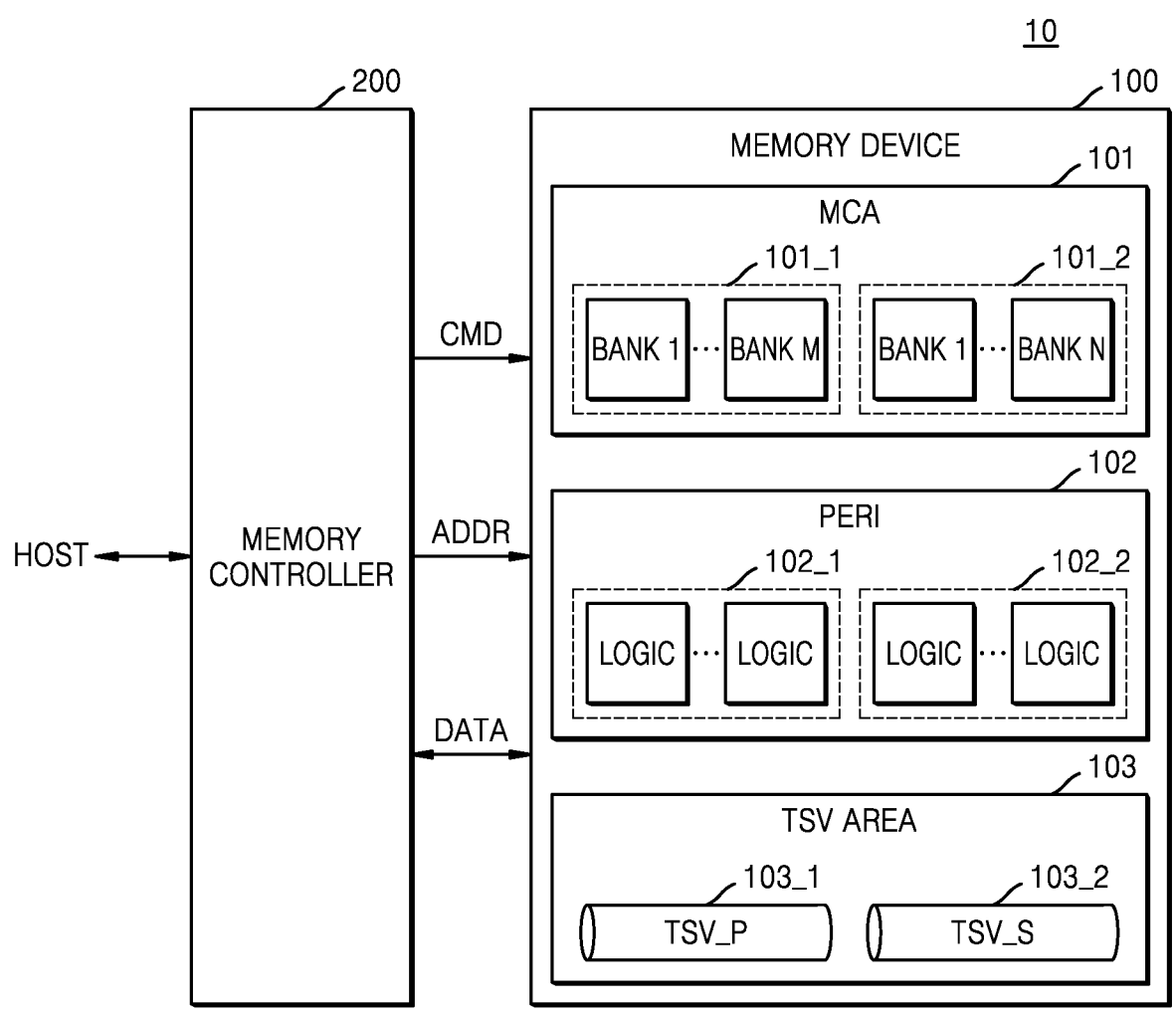
FIG. 1 is a block diagram illustrating an electronic device according to an example embodiment of the inventive concept.

FIG. 1 is a block diagram illustrating an electronic device 10 according to an example embodiment of the inventive concept.

Referring to FIG. 1, the electronic device 10 includes a memory controller 200 (e.g., a control circuit) and a memory device 100. Each of the memory controller 200 and the memory device 100 may exchange various signals by including an interface circuit (not shown). For example, the memory controller 200 may provide a clock signal, and a command/address CMD/ADDR to the memory device 100 to access data stored in the memory device 100.

In an embodiment, the memory device 100 includes a memory cell array 101, a PERI area 102, and a TSV area 103. The memory cell array 101 may include a plurality of bank areas. In FIG. 1, first and second bank areas 101_1 and 101_2 are illustrated, and each of the first and second bank areas 101_1 and 101_2 may include one or more banks. As an example, the first bank area 101_1 may include M banks BANK 1 to BANK M, and the second bank area 101_2 may include N banks BANK 1 to BANK N. Also, each bank may include a plurality of memory cells.

The PERI area 102 may provide a plurality of signals for accessing data, such as writing data to a plurality of memory cells or reading data from the plurality of memory cells. The PERI area 102 is located around the memory cell array 101 on a semiconductor substrate, so that the PERI area 102 may provide signals necessary for data access to a plurality of bank areas included in the memory cell array 101 or a memory cell array included in each of a plurality of bank areas. The PERI area 102 may be referred to as a peripheral circuit or a peripheral area.

The PERI area 102 may include a plurality of logics or logic circuits to provide a plurality of signals to the memory cell array 101. In an example embodiment, the PERI area 102 include operation logic (e.g., a first logic circuit) and control logic (e.g., a second logic circuit).

In an example embodiment, the operation logic (not shown) includes a plurality of processing elements PE respectively corresponding to a plurality of banks. The processing element PE is a device that performs an operation in the memory device 100 and may be referred to as a processor in memory (PIM). In an embodiment, the PIM includes only the processing element PE. However, according to another embodiment of the inventive concept, each PIM includes the above-described processing element PE and other elements that control the processing element PE. The processing element PE may include various types of operators or units to perform operations. As an example, the processing element may include an operator such as a single instruction multi data (SIMD), an arithmetical and logical unit (ALU), and a multiply-accumulator (MAC). For example, the processing element PE may perform data invert, data shift, data swap, data compare, logical operations such as AND and XOR, mathematical operations such as addition and subtraction, and a data operation.

According to an example embodiment, one processing element PE is disposed in correspondence with one bank. Alternatively, according to various embodiments, a plurality of processing elements PE may be disposed corresponding to one bank, or two or more banks may share one processing element PE. In addition, each processing element PE may perform an operation processing at least one of data from the host HOST and data read from the memory cell array 101.

In an example embodiment, the control logic (not shown) includes a command/address decoder (not shown), performs a decoding operation on the command/address (CMD/ADDR), and controls operation processing and memory operations based on the decoding result.

According to an example embodiment, a plurality of logics provided in the PERI area 102 are classified into a first logic group 102_1 and a second logic group 102_2. For example, first and second logic groups 102_1 and 102_2 may be provided to correspond to the first and second bank areas 101_1 and 101_2, respectively.

Although not shown in the drawings, according to an example embodiment of the inventive concept, the PERI area 102 may include a mode controller, and a mode setting operation for the first and second bank areas 101_1 and 101_2 and/or the first and second logic groups 102_1 and 102_2 may be controlled based on the control of the mode controller. For example, any one of the two logic groups, that is, the first and second logic groups 102_1 and 102_2, may be selected in the PERI area 102 using the mode controller, and any one of the two bank areas, that is, the first and second bank areas 101_1 and 101_2, may be selected in the memory cell array 101 using the mode controller. The mode controller may be implemented in various forms. As an example, the mode controller may be implemented separately from the command/address decoder, or at least a part of the mode controller may be included in the command/address decoder.

In an exemplary embodiment, the TSV area 103 is an area including a TSV structure penetrating the semiconductor substrate on which the memory cell array 101 and/or the PERI area 102 is mounted. The TSV structure may increase the density of the memory device 100 by penetrating at least one memory chip. Use of the TSV structure may increase processing speed and/or decrease power consumption as compared to conventional wire bonding technology. In an exemplar embodiment, the TSV structure is formed by a silicon electrode vertically penetrating the semiconductor substrate. Accordingly, the TSV structure may be referred to as a through-silicon electrode.

The TSV structure (e.g., a TSV) may be composed of several metals. In an example embodiment, the TSV is formed by penetrating a semiconductor substrate to form a via hole (not shown) and then filling the hole with copper. In an embodiment, the TSV structure includes a metal barrier layer formed on a sidewall of the TSV and an insulating layer formed on the sidewall of the metal barrier layer. The TSV may further include a nitride layer (not shown) disposed on the sidewall of the insulating layer. The insulating layer may be formed of an oxide film.

After the TSV is formed, copper ions forming the TSV may flow into the semiconductor substrate along the insulating layer during an additional process. In particular, copper ions are collected in the active zone, causing a bridge between transistors, and such a bridge may cause a defect in a semiconductor element.

Problems such as poor operation of a semiconductor element due to copper ion migration may be caused in a thermal cycling step in which thermal and mechanical stress is applied to silicon surrounding the TSV during a semiconductor process. In detail, thermal mismatch stress on active silicon may affect carrier mobility. Accordingly, a semiconductor element formed adjacent to the TSV may have poor electrical characteristics and poor reliability. In an exemplary embodiment, a keep-out zone excluding circuits and wirings is formed in an area adjacent to the TSV to improve the electrical characteristics. In an embodiment, the size or area of the keep-out zone is different for each process and manufacturer.

As the demand for high integration, high speed, and low power increases, the pitch (e.g., distance between TSVs) is decreasing in order to meet the demand. For example, while the pitch has previously been set to 30 μm×30 μm, the pitch may be reduced further in response to the demand for high integration. While the arrangement area of the circuit implemented as a semiconductor element is relatively constant, as the pitch decreases, the overhead of the keep-out zone increases because the keep-out zone in which circuits and wirings are not arranged is constant. According to an embodiment of the inventive concept, in a semiconductor device, space efficiency may be increased by disposing semiconductor elements (e.g., power capacitors, metal oxide semiconductor (MOS) capacitors, active resistors, etc.) considered relatively insensitive to TSV thermal expansion (or thermal mismatch stress) in the keep-out zone.

According to an exemplary embodiment of the inventive concept, the TSV area 103 includes at least one power TSV 103_1 and at least one signal TSV 103_2. The power TSV 103_1 may function as a through electrode capable of supplying power to the plurality of memory chips by receiving power from the PERI area 102 or from the outside, and the signal TSV 103_2 may function as a through electrode capable of supplying signals (e.g., electrical signals) to the plurality of memory chips by receiving a signal from the PERI area 102 or from the outside.

According to an example embodiment of the inventive concept, the power TSV 103_1 supplies power to a logic group or bank area requiring a power supply. According to an example embodiment, the power TSV 103_1 supplies power to the first logic group 102_1 and the first bank area 101_1. Similarly, the signal TSV 103_2 may supply a signal to a logic group or bank area requiring a signal supply. According to an example embodiment, the signal TSV 103_2 supplies signals to the second logic group 102_2 and the second bank area 101_2, so that data may be written to or read from a memory cell. The mode controller included in the PERI area 102 may control logic to provide power to the power TSV 103_1, and control the logic to provide a signal to the signal TSV 103_2.

The memory device 100 may be dynamic random access memory (DRAM) such as Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), DDR2 SDRAM, DDR3 SDRAM, and DDR4 SDRAM. However, embodiments of the inventive concept are not limited thereto. As an example, the memory device 100 may be implemented with nonvolatile memory such as flash memory, Magnetic RAM (MRAM), spin transfer torque MRAM, conductive bridging RAM (CBRAM), Ferroelectric RAM (FeRAM), phase change RAM (PRAM), and resistive RAM (ReRAM). Furthermore, it may be implemented with a non-memory semiconductor to which TSV technology is applied.

Also, the memory device 100 may correspond to one semiconductor chip, or may have a configuration corresponding to one channel in a memory device including a plurality of channels having independent interfaces. Alternatively, the memory device 100 may have a configuration corresponding to a memory module, or the memory module may include a plurality of memory chips, and the memory device 100 of FIG. 1 may correspond to one memory chip mounted on a module board.

Various types of operation processing operations may be performed in the memory device 100. As an example, at least some of a plurality of operations for a neural network (or artificial neural network) function in connection with artificial intelligence may be performed in the memory device 100. For example, the host HOST may control the memory device 100 through the memory controller 200 so that at least some of the plurality of operations are performed by the memory device 100. Hereinafter, an example of a configurable mode setting operation for a plurality of banks is described according to example embodiments of the inventive concept.

The memory controller 200 may access the memory device 100 according to a request from the host HOST, and the memory controller 200 may communicate with the host HOST using various protocols. According to example embodiments, the memory controller 200 may correspond to a host HOST, or the memory controller 200 may correspond to a configuration included in the host HOST. A data processing system may include the host HOST and the memory device 100. Accordingly, the electronic device 10 may correspond to a data processing system or be defined as a configuration included in the data processing system.

The memory controller 200 may control the memory device 100 to read data stored in the memory device 100 or program data in the memory device 100 in response to a read/write request from a host HOST. In detail, the memory controller 200 may control program, read, and erase operations for the memory device 100 by providing a command CMD, an address ADDR, and a control signal CTRL to the memory device 100. In addition, data DATA for programming and the read data DATA may be transmitted and received between the memory controller 200 and the memory device 100.

In an example embodiment, the memory controller 200 may determine the amount of computations and/or the frequency of data access based on various causes, such as the type of application being executed, and may change the mode of the first and second bank areas 101_1 and 101_2 based on the determination. The memory controller 200 may set and change a mode for each bank area in the memory device 100, and accordingly, may adaptively change an operation resource and a memory operation resource. As an example, an operation speed may be improved by setting a relatively large number of bank areas to the operation mode in order to perform a large amount of operation processing. On the other hand, when the amount of operation processing is relatively small, the number of bank areas set to the operation mode may be reduced. That is, by adaptively adjusting the resource for operation processing and the resource for memory operation, a speed of the memory operation together with the operation speed may be improved.

The electronic device 10 or a data processing system including the same may be implemented as a personal computer (PC), a data server, a cloud system, an artificial intelligence server, a network-attached storage (NAS), an internet of things (IoT) device, or a portable electronic device. Further, when the data processing system is a portable electronic device, the data processing system may be a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

According to an example embodiment of the inventive concept, because a semiconductor element is disposed in a keep-out zone that has not been used before, space efficiency may be increased. In addition, according to an embodiment of the inventive concept, because semiconductor elements having different electrical characteristic sensitivities depending on the type of TSV are disposed in the keep-out zone, space efficiency may be increased. Further, according to an embodiment of the inventive concept, a power capacitor is disposed in the keep-out zone. As a result of an increase in total capacitance due to the power capacitor being disposed in the keep-out zone, noise due to power may be improved.

Figure 2A:
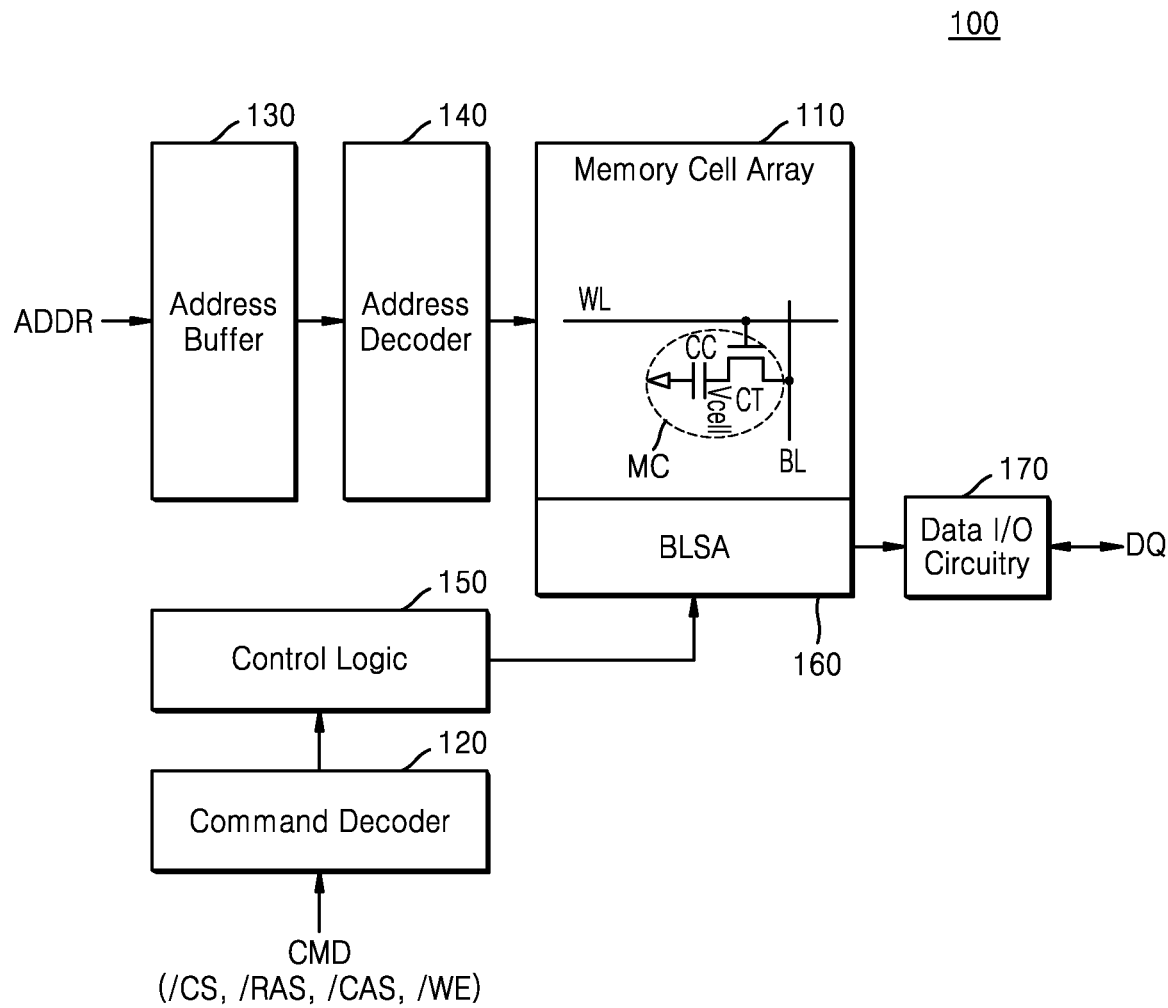
FIGS. 2A, 2B, and 2C are block diagrams illustrating the memory device of FIG. 1 according to an example embodiment of the inventive concept.
Figure 2B:
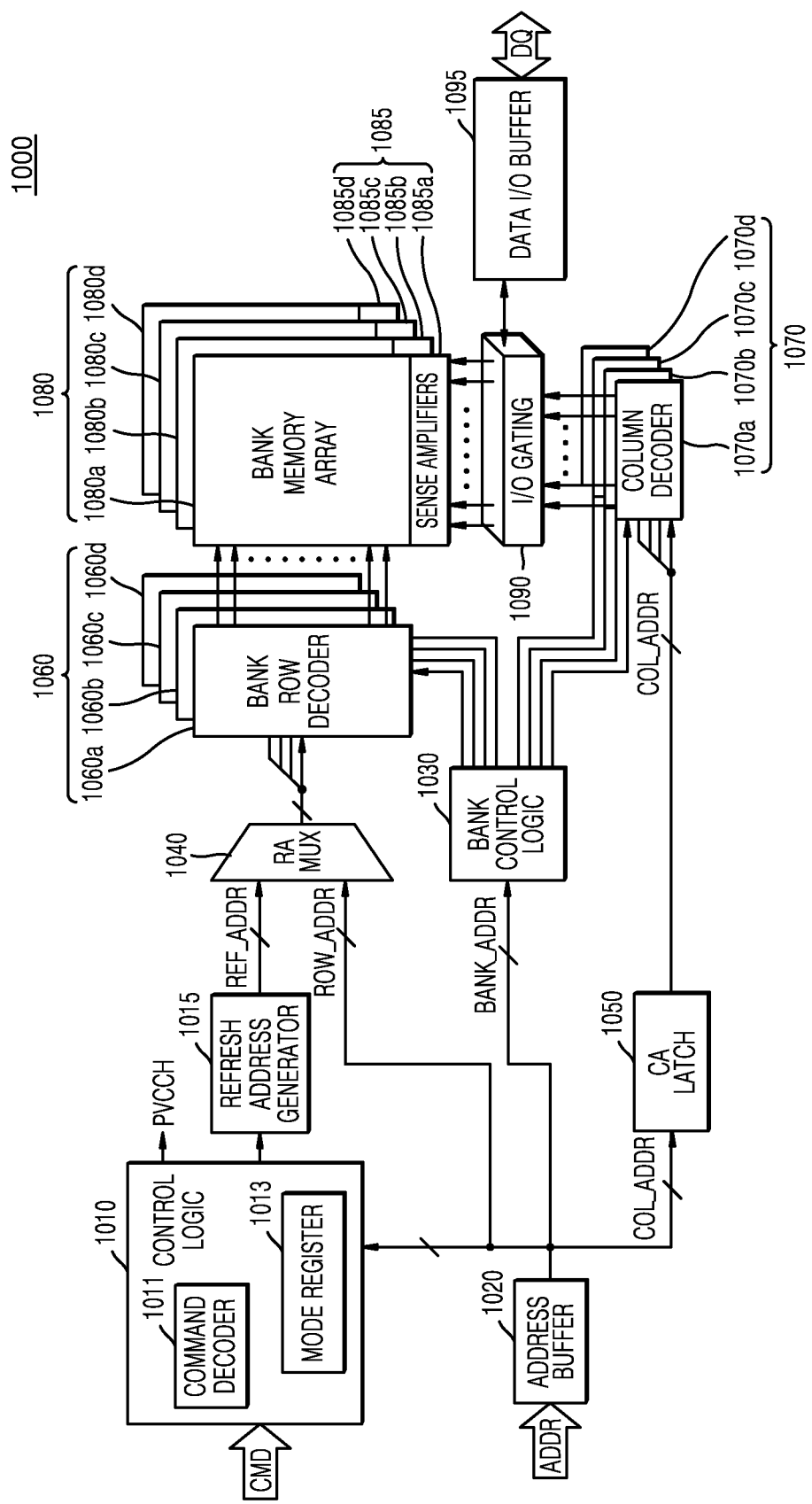
Figure 2C:
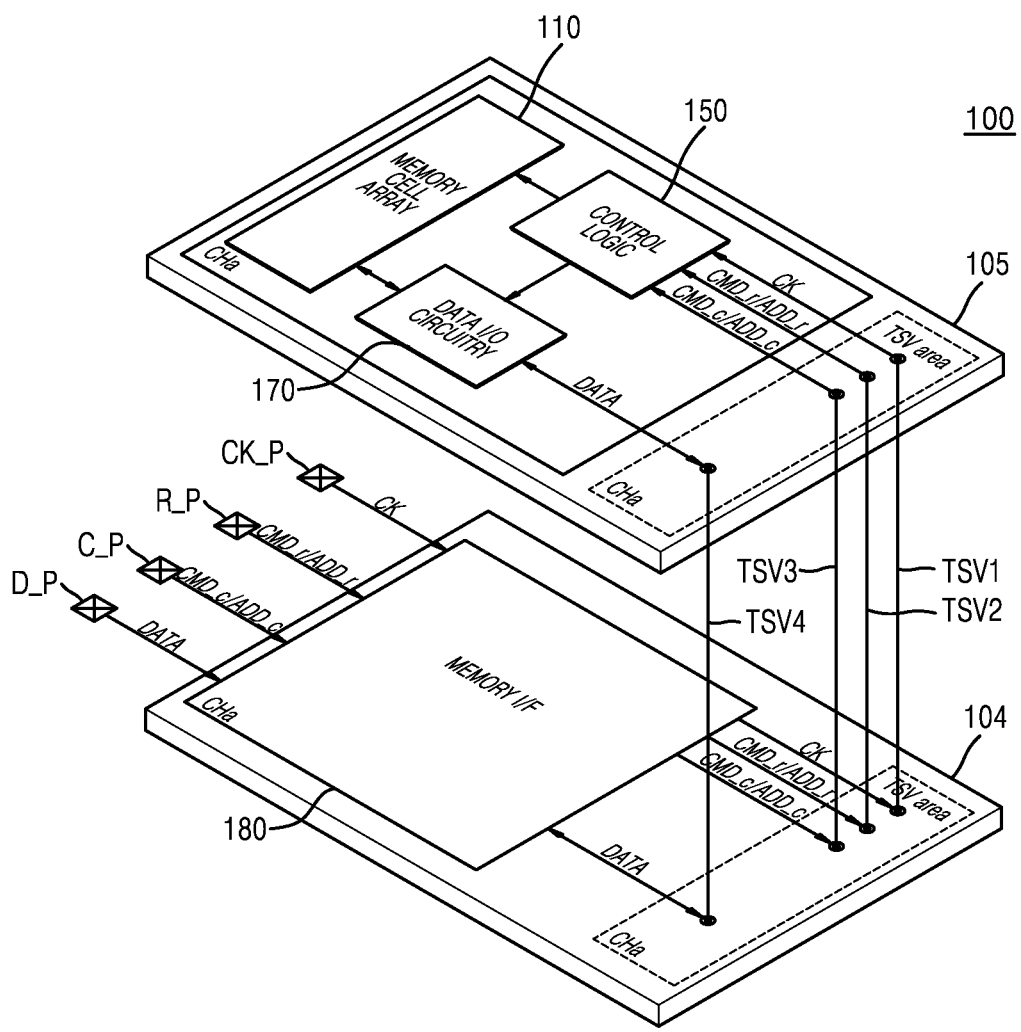

FIGS. 2A, 2B, and 2C are block diagrams illustrating in detail the memory device 100 of FIG. 1 according to an example embodiment of the inventive concept.

FIGS. 2A, 2B, and 2C illustrate various methods or viewpoints of implementing the memory devices 100 and 1000 of FIG. 1, respectively. In FIGS. 2A, 2B, and 2C, various embodiments of the inventive concept, and the configurations described in FIG. 1 are described from different viewpoints according to various embodiments. FIGS. 2A, 2B, and 2C are referenced in connection with FIG. 1.

Referring to FIG. 2A, the memory device 100 is an embodiment in which the inventive concept is implemented as a memory device. The memory device 100 may be implemented as DRAM that senses the cell voltage Vcell stored in the memory cell MC as multi-bit data. The memory device 100 may be referred to as a multi-level DRAM.

The memory device 100 may input/output data DQ (corresponding to data DATA of FIG. 1) in response to a command CMD and an address ADDR received from an external device, for example, a host such as a central processing unit (CPU) or a memory controller (200 of FIG. 1). The memory device 100 may include a memory cell array 110, a command decoder 120, an address buffer 130, an address decoder 140, a control logic 150, a sense amplifier 160, and a data input/output circuitry 170.

The memory cell array 110 includes a plurality of memory cells MCs provided in a two-dimensional matrix form arranged in rows and columns. The memory cell array 110 includes a plurality of word lines WLs and a plurality of bit lines BLs connected to the memory cells MCs. Each of the memory cells MCs may be configured at one of intersections of the plurality of word lines WLs and the plurality of bit lines BLs. Each of the memory cells MCs includes a cell transistor CT and a cell capacitor CC. The gate of the cell transistor CT is connected to one of the word lines WLs arranged in the row direction of the memory cell array 110. One end of the cell transistor CT is connected to one of the bit lines BLs arranged in the column direction of the memory cell array 110. The other end of the cell transistor CT is connected to the cell capacitor CC. The cell capacitor CC may store electric charges of various capacities corresponding to multi-bit data, for example, 2-bit data. In addition, the cell capacitor CC may be restored to an amount of charge corresponding to the capacity of each of the multi-bit data, that is, to the cell voltage Vcell.

The memory cell MC may store a cell voltage Vcell having a size specifying 2-bit data in the cell capacitor CC. The cell voltage Vcell may be expressed as 2-bit data including a most significant bit (MSB) and a least significant bit (LSB). Depending on the embodiment, the memory cell MC may store multi-bit data of n (n is a number greater than 2) bits or more.

The command decoder 120 may determine a type of an input command CMD by referring to a chip select signal/CS, row address strobe signal/RAS, column address strobe signal/CAS, or write enable signal/WE applied from an external device. The command decoder 120 may generate control signals corresponding to the type of the command CMD. The command CMD may include an active command, a read command, a write command, a precharge command, an erase command, etc.

The address buffer 130 receives an address ADDR applied from the external device. The address ADDR includes a row address for addressing a row of the memory cell array 110 and a column address for addressing a column of the memory cell array 110. The address buffer 130 may transmit each of a row address and a column address to the address decoder 140.

The address decoder 140 may include a row decoder and a column decoder for selecting the word line WL and the bit line BL of the memory cell MC to be accessed in response to the received address ADDR. The row decoder may decode the row address to enable the word line WL of the memory cell MC corresponding to the row address. The column decoder may decode the column address to provide a column selection signal (i.e., CSL) for selecting the bit line BL of the memory cell MC corresponding to the column address.

The control logic 150 may control the sense amplifier 160 under the control of the command decoder 120. The control logic 150 may control the operation of the sense amplifier 160 when the sense amplifier 160 senses the cell voltage Vcell of the memory cell MC. The control logic 150 may control the sense amplifier 160 to sequentially perform a pre-charge operation, an offset removal operation, an MSB sense operation, an LSB sense operation, and a restore operation.

The sense amplifier 160 may sense the electric charge stored in the memory cell MC as 2-bit data. The sense amplifier 160 may sense the least significant bit (LSB) of 2-bit data, sense the most significant bit (MSB) of 2-bit data, and restore a bit line voltage generated by combining the sensed MSB and LSB data as a cell voltage to a memory cell. Further, the sense amplifier 160 may transmit the sensed 2-bit data to the data input/output circuitry 170 to output the sensed 2-bit data to the outside of the memory device 100 through a data (DQ) pad(s).

The data input/output circuitry 170 may receive data DQ to be written in the memory cells MCs from the outside and transmit the data DQ to the memory cell array 110. The data input/output circuitry 170 may output 2-bit data sensed by the sense amplifier 160 as read data to the outside through the data (DQ) pad(s). According to an embodiment, the data input/output circuitry 170 may serially output MSB data and LSB data through one data (DQ) pad when outputting the sensed 2-bit data to the outside. Conversely, LSB data and MSB data may be serially output through one data (DQ) pad. According to another embodiment, the data input/output circuitry 170 may output the sensed 2-bit data in parallel through two data (DQ) pads. For example, MSB data may be output through a first data (DQ_MSB) pad, and LSB data may be output through a second data (DQ_LSB) pad.

FIG. 2B describes the memory device 100 of FIG. 2A in more detail. In an example embodiment, the memory cell array 110 of FIG. 2A may be a bank memory array 1080 of FIG. 2B, the command decoder 120 of FIG. 2A may be a command decoder 1011 of FIG. 2B, and the address buffer 130 of FIG. 2A may be an address buffer 1020 of FIG. 2B. The control logic 150 of FIG. 2A may be a control logic 1010 of FIG. 2B, and the address decoder 140 of FIG. 2A may be a bank row decoder 1060 of FIG. 2B. The sense amplifier 160 of FIG. 2A may be a column decoder 1070 of FIG. 2B. An input/output gating circuit 1090, and a sense amplifier unit 1085, and the data input/output circuitry 170 of FIG. 2A may be a data input/output buffer 1095 of FIG. 2B.

Referring to FIG. 2B, the memory device 1000 includes a control logic 1010, a refresh address generator 1015, the address buffer 1020, a bank control logic 1030, a row address multiplexer 1040, a column address latch 1050, the row decoder 1060, the column decoder 1070, the memory cell array 1080, a sense amplifier unit 1085, an input/output gating circuit 1090, and the data input/output buffer 1095.

The memory cell array 1080 includes first to fourth bank arrays 1080a, 1080b, 1080c, and 1080d. Each of the first to fourth bank arrays 1080a, 1080b, 1080c, and 1080d includes a plurality of word lines, a plurality of bit lines, and a plurality of memory cells formed at the intersections of word lines and bit lines. In an alternate embodiment, the memory cell array 1080 may include less than the four bank arrays or more than the four bank arrays.

The row decoder 1060 may include first to fourth bank row decoders 1060a, 1060b, 1060c, and 1060d respectively connected to the first to fourth bank arrays 1080a, 1080b, 1080c, and 1080d. The column decoder 1070 may include first to fourth bank column decoders 1070a, 1070b, 1070c, and 1070d respectively connected to the first to fourth bank arrays 1080a, 1080b, 1080c, and 1080d. The sense amplifier unit 1085 may include first to fourth bank sense amplifiers 1085a, 1085b, 1085c, and 1085d respectively connected to the first to fourth bank arrays 1080a, 1080b, 1080c, and 1080d. The number of the bank row decoders, the number of bank column decoders, and the number of bank sense amplifiers may correspond to the number of bank arrays present.

The first to fourth bank arrays 1080a, 1080b, 1080c, and 1080d, the first to fourth bank row decoders 1060a, 1060b, 1060c, and 1060d, the first to fourth bank column decoders 1070a, 1070b, 1070c, and 1070d and the first to fourth bank sense amplifiers 1085a, 1085b, 1085c, and 1085d may constitute first to fourth memory banks, respectively. In the present embodiment, an example of the memory device 1000 including four memory banks is shown, but the inventive concept is not limited thereto as the memory device 1000 may include any number of memory banks.

The control logic 1010 may control the operation of the memory device 1000. The control logic 1010 may generate a power stabilization signal PVCCH when the level of the power supply voltage driving the memory device 1000 is stably maintained, and control the memory device 1000 to be in an operable state using the power stabilization signal PVCCH. In an embodiment, the power stabilization signal PVCCH is used to generate a power supply voltage of a constant level.

The control logic 1010 may generate control signals so that the memory device 1000 performs a write operation or a read operation. In an embodiment, the control logic 1010 includes a command decoder 1011 for decoding a command CMD received from the memory controller and a mode register 1013 for setting an operation mode of the memory device 1000. The command decoder 1011 may decode a write enable signal/WE, a row address strobe signal/RAS, a column address strobe signal/CAS, and a chip select signal/CS to generate control signals corresponding to the command CMD. The mode register 1013 may provide a plurality of operation options of the memory device 1000 and may program various functions, characteristics, and modes of the memory device 1000.

The control logic 1010 may control the refresh address generator 1015 to perform an auto refresh operation in response to a refresh command, or may control the refresh address generator 1015 to perform a self refresh operation in response to a self-refresh entry command. The refresh address generator 1015 may generate a refresh address REF_ADDR corresponding to a memory cell row in which a refresh operation is to be performed. The refresh address generator 1015 may generate a refresh address REF_ADDR at a refresh period defined by a standard for a volatile memory device. In an embodiment, when the memory device 1000 is a nonvolatile memory device described above, the refresh address generator 1015 is omitted.

The address buffer 1020 may receive an address ADDR including a bank address BANK_ADDR, a row address ROW_ADDR, and a column address COL_ADDR from the memory controller. In addition, the address buffer 1020 may provide the received bank address BANK_ADDR to the bank control logic 1030, may provide the received row address ROW_ADDR to the row address multiplexer 1040, and may provide the received column address COL_ADDR to the column address latch 1050.

The bank control logic 1030 may generate bank control signals in response to the bank address BANK_ADDR. In response to the bank control signals, a bank row decoder corresponding to the bank address BANK_ADDR among the first to fourth bank row decoders 1060a, 1060b, 1060c, and 1060d is activated, and a bank column decoder corresponding to the bank address BANK_ADDR among the first to fourth bank column decoders 1070a, 1070b, 1070c, and 1070d is activated.

The row address multiplexer 1040 may receive a row address ROW_ADDR from the address buffer 1020 and may receive a refresh row address REF_ADDR from the refresh address generator 1015. The row address multiplexer 1040 may selectively output one of a row address ROW_ADDR and a refresh row address REF_ADDR. The row address output from the row address multiplexer 1040 may be applied to the first to fourth bank row decoders 1060a, 1060b, 1060c, and 1060d, respectively.

Among the first to fourth bank row decoders 1060a, 1060b, 1060c, and 1060d, the bank row decoder activated by the bank control logic 1030 may decode the row address output from the row address multiplexer 1040 to activate a word line corresponding to the row address. For example, the activated bank row decoder may apply a word line driving voltage to a word line corresponding to a row address.

The column address latch 1050 may receive the column address COL_ADDR from the address buffer 1020 and temporarily store the received column address COL_ADDR. The column address latch 1050 may gradually increase the column address COL_ADDR received in the burst mode. The column address latch 1050 may apply a temporarily stored or gradually increased column address COL_ADDR to the first to fourth bank column decoders 1070*a*, 1070*b*, 1070*c*, and 1070*d*, respectively.

Among the first to fourth bank column decoders 1070*a*, 1070*b*, 1070*c*, and 1070*d*, the bank column decoder activated by the bank control logic 1030 may activate a sense amplifier corresponding to the bank address BANK_ADDR and the column address COL_ADDR through the input/output gating circuit 1090.

The input/output gating circuit 1090 may include an input data mask logic, read data latches for storing read data output from the first to fourth bank arrays 1080*a*, 1080*b*, 1080*c*, and 1080*d*, and a write driver for writing data to the first to fourth bank arrays 1080*a*, 1080*b*, 1080*c*, and 1080*d*, together with circuits for gating input/output data DQ.

Read data output from one of the first to fourth bank arrays 1080*a*, 1080*b*, 1080*c*, and 1080*d* may be sensed by sense amplifiers corresponding to one bank array and stored in the read data latches. Write data to be written to the memory cell array of one of the first to fourth bank arrays 1080*a*, 1080*b*, 1080*c*, and 1080*d* may be provided from the memory controller to the data input/output buffer 1095. Data provided to the data input/output buffer 1095 may be written to one bank array through a write driver.

The data input/output buffer 1095 may receive a test pattern signal provided from a tester (e.g., a tester circuit) as input/output data DQ during a wafer level test, and provide the test pattern signal to the input/output gating circuit 1090. The input/output gating circuit 1090 may write a test pattern signal to a target page of the memory cell array 1080 during a wafer level test, read the test pattern signal from the target page, and provide the read test pattern signal to the data input/output buffer 1095 as a test result signal. The data input/output buffer 1095 may output the test result signal as input/output data DQ.

FIG. 2C is an example diagram of the stacked memory device of FIG. 2A. Referring to FIG. 2C, the memory device 100 includes a buffer die 104 and a core die 105. The core die 105 may support a channel CHa among a plurality of channels. The buffer die 104 and the core die 105 may communicate through TSVs TSV1 to TSV4 located in the TSV area. The TSVs TSV1 to TSV4 may be located in a TSV area corresponding to the channel CHa. For example, the buffer die 104 may transmit a clock signal CK to the core die 105 through the TSV TSV1, may transmit a row command/row address CMD_r/ADDR_r to the core die 105 through the TSV TSV2, may transmit a column command/column address CMD_c/ADDR_c to the core die 105 through the TSV TSV3, and may transmit and receive data DATA to and from the core die 105 through the TSV TSV4. In FIG. 2C, each of the TSVs TSV1 to TSV4 is shown to be implemented as one TSV, but each of the TSVs TSV1 to TSV4 may be implemented as a variable number of TSVs.

The buffer die 104 includes a memory interface circuit 180 corresponding to the channel CHa. The memory interface circuit 180 may receive the clock signal CK, the row command/row address CMD_r/ADDR_r, the column command/column address CMD_c/ADDR_c, and the data DATA transmitted to the channel CHa through a clock pin CK_P, a row pin R_P, a column pin C_P, and a data pin D_P corresponding to the channel CHa. The memory interface circuit 180 may transmit the clock signal CK, the row command/row address CMD_r/ADDR_r, the column command/column address CMD_c/ADDR_c, and the data DATA to the core die 105 through the TSVs TSV1 to TSV4. In an example embodiment, the memory interface circuit 180 may transmit the clock signal CK, the row command/row address CMD_r/ADDR_r, the column command/column address CMD_c/ADDR_c, and the data DATA signal-processed through signal processing to the core die 105. The memory interface circuit 180 may transmit data DATA transmitted from the core die 105 through the TSV TSV4 to an external host device (e.g., the memory controller 200 of FIG. 1).

The core die 105 includes a control logic 150, a data input/output circuit 170, and a memory cell array 110. The control logic 150, the data input/output circuit 170, and the memory cell array 110 may be circuits for supporting the channel CHa. The memory cell array 110 may be included in one of the memory banks included in the channel CHa.

The control logic 150 may receive the clock signal CK, the row command/row address CMD_r/ADDR_r, and the column command/column address CMD_c/ADDR_c transmitted through the TSVs TSV1 to TSV3 from the buffer die 104. The control logic 150 may decode the received row command/row address CMD_r/ADDR_r and the column command/column address CMD_c/ADDR_c. In an example embodiment, the control logic 150 may detect a command (e.g., a precharge command PRE) by decoding the row command CMD_r received at the rising edge of the clock signal CK, and may detect a command by decoding the row command CMD_r received at the falling edge of the clock signal CK. The control logic 150 may control the data input/output circuit 170 and the memory cell array 110 based on the decoding result.

The data input/output circuit 170 may transmit/receive data DATA to and from the buffer die 104 through the TSV TSV4. In the write operation, the data input/output circuit 170 may transmit data DATA transmitted from the buffer die 104 through the TSV TSV4 to the memory cell array 110. Accordingly, the memory cell array 110 may store data DATA. In the read operation, the data input/output circuit 170 may transmit data DATA output from the memory cell array 110 to the buffer die 104 through the TSV TSV4.

In FIG. 2C, it is illustrated that the row command CMD_r and the column command CMD_c are decoded in the core die 105 through the control logic 150 of the core die 105, but the inventive concept is not limited thereto. For example, the row command CMD_r and the column command CMD_c may be decoded through a command decoder included in the memory interface circuit 180 of the buffer die 104.

Figure 3:
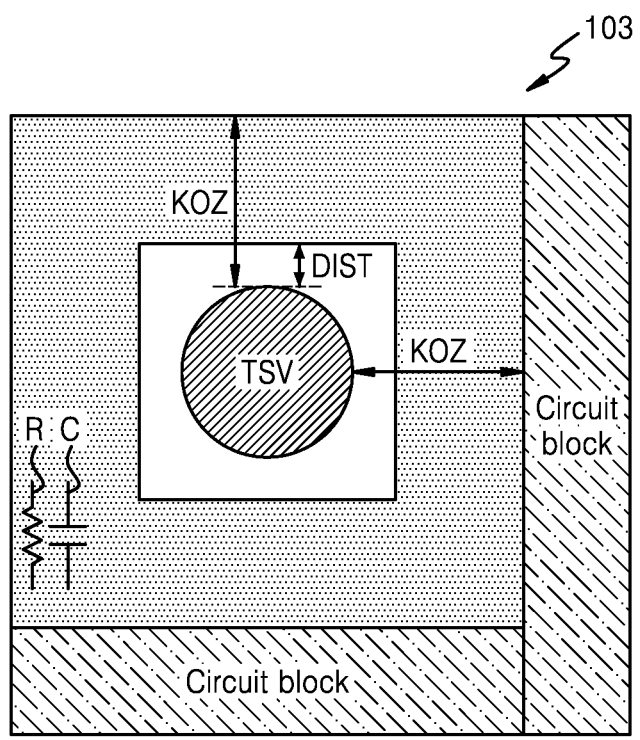
FIG. 3 is a top view illustrating an arrangement of a semiconductor substrate and a TSV according to an example embodiment of the inventive concept.

FIG. 3 is a top view showing an arrangement of a semiconductor substrate and a TSV in a TSV area 103 according to an example embodiment of the inventive concept.

Referring to FIG. 3, a semiconductor substrate constituting a semiconductor device and a TSV formed perpendicular to the semiconductor substrate are shown.

As described above, the semiconductor device does not arrange circuits or wirings in the keep-out zone KOZ by setting a keep-out zone KOZ spaced apart from the TSV by a predetermined distance in order to prevent the carrier mobility of active silicon near the TSV from being reduced. In an example embodiment, the keep-out zone KOZ is an area in which carrier mobility or ionic activity falls by a certain value (e.g., 5%) or more, and a semiconductor element in the keep-out zone KOZ may have poor electrical characteristics. However, an embodiment of the inventive concept is not limited thereto. For example, the keep-out zone KOZ may be defined as a region in which the activity of the ion current decreases by 10% or more, and various other embodiments may be included. In an example embodiment, the keep-out zone KOZ is an area in which carrier mobility or ionic activity falls by a value ranging from 5% to 10%. In an example embodiment of the inventive concept, a horizontal or vertical width of the keep-out zone KOZ is less than or equal to 15 μm (micron), which is half the pitch, but may vary depending on process characteristics, and is not limited to these values. For example, the horizontal or vertical width of the keep-out zone KOZ may be 6 μm (micron) or less.

According to an example embodiment of the inventive concept, the keep-out zone KOZ is a space from the outermost portion of the cylindrical TSV to a circuit block that is a circuit area for driving a semiconductor device. In other words, the keep-out zone KOZ may be a boundary from a circle, which is a shape of the TSV, to a square, which is a circuit block largely surrounding the TSV.

In an example embodiment, the circuit block may be referred to as an active zone of a semiconductor element. By implementing the circuit in the circuit block, the semiconductor element may perform a function contained in the implemented circuit. Among the semiconductor elements constituting the circuit, semiconductor elements located in the circuit block (i.e., the active zone) are not implemented or located in the keep-out zone KOZ because the semiconductor devices are vulnerable to changes in electrical characteristics due to deterioration of the TSV.

According to an embodiment of the inventive concept, in the semiconductor device, semiconductor elements (e.g., a resistance element or a power storage element) that are relatively less sensitive to changes in electrical characteristics due to deterioration of the TSV are disposed in an area of the keep-out zone KOZ from a point spaced apart from the TSV by a predetermined distance DIST to a circuit block. In an embodiment of the inventive concept, semiconductor elements less sensitive to changes in electrical characteristics are disposed in a space from the point separated by a predetermined distance DIST from the TSV to the circuit block, and the space may be referred to as an element area. When the element area is too close to the TSV, even semiconductor elements that are relatively less sensitive to the change in electrical characteristics may have a large change in electrical characteristics. Accordingly, the element area needs to be spaced apart from the TSV by the predetermined distance DIST.

According to an example embodiment of the inventive concept, as semiconductor elements relatively less sensitive to changes in electrical characteristics are disposed in the element area included in the keep-out zone KOZ, a part of the keep-out zone KOZ, which was an idle area, is now utilized, and the space efficiency of the entire semiconductor device may be increased.

According to an example embodiment of the inventive concept, a power capacitor that may be modeled as a metal oxide semiconductor (MOS) transistor may be relatively insensitive to changes in electrical characteristics due to thermal expansion of a TSV. Thus, in an exemplary embodiment, the power capacitor is disposed in the element area.

According to the example embodiment of the inventive concept, since the power capacitor is located in the element area, the total power capacitance of the semiconductor substrate including the circuit block may be increased. Because the total power capacitance has a characteristic inversely proportional to the noise, as the total power capacitance increases, the semiconductor device may be more robust against noise. As described above, a TSV for supplying power to a semiconductor substrate through a power capacitor may be referred to as a power TSV.

According to the example embodiment of the inventive concept, the space efficiency of a semiconductor substrate may be increased as the MOS capacitor is disposed in the element area. In an embodiment, the MOS capacitor includes a MOS Field Effect Transistor (MOSFET) as a capacitor. MOS capacitors are relatively insensitive to changes in electrical properties.

According to an example embodiment of the inventive concept, the space efficiency of a semiconductor substrate may be increased when an active resistor is disposed in the element area. In an embodiment, the active resistor partially uses the structure of a transistor, but is modeled as a resistance element using ions doped in silicon forming a substrate without forming a gate. The resistance value of the active resistor may vary depending on the composition or degree of ions doped in silicon. In an exemplary embodiment, the active resistor is configured to have a resistance value different depending on a configuration of a source-drain well area of the transistor. Active resistors are also relatively insensitive to changes in electrical characteristics.

Figure 4:
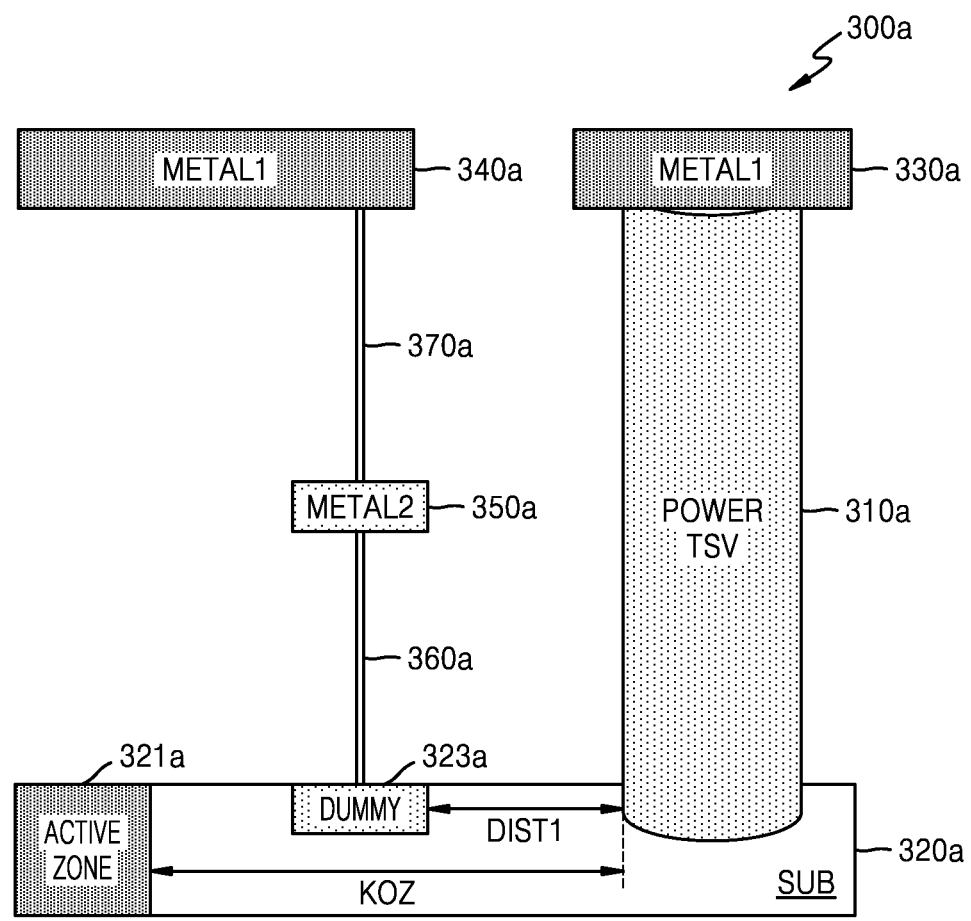
FIG. 4 is a front view showing an arrangement of a semiconductor substrate and a TSV according to an example embodiment of the inventive concept.

FIG. 4 is a front view illustrating an arrangement of a semiconductor substrate 320a and a TSV 310a according to an example embodiment of the inventive concept. FIG. 4 shows a case where the TSV is a power TSV 310a that delivers power.

Referring to FIG. 4, a semiconductor device 300a includes a semiconductor substrate 320a, the power TSV 310a, first metals 330a and 340a (e.g., metal layers), a second metal 350a (e.g., a metal layer), and power lines 360a and 370a.

The semiconductor substrate 320a may include an active zone 321a corresponding to a part of the circuit block of FIG. 3 and capable of functioning as a part of a circuit by forming a channel. Also, the keep-out zone KOZ may be set by a distance from the power TSV 310a on the semiconductor substrate 320a to the active zone 321a.

The power TSV 310a penetrates the semiconductor substrate 320a and may be formed in a direction perpendicular to the semiconductor substrate 320a. The first metal 330a is connected to an upper surface of the power TSV 310a.

In an embodiment, the first metal 340a having the same composition as the first metal 330a may be formed on a side of the first metal 330a. For example, the material(s) used to form the first metal 340a may the same as the material(s) used to form the first metal 330a. However, the first metal 340a is not connected to the second metal 330a. For example, the first metal 340a could be spaced apart to the left of the first metal 330a. One end of the power line 370a is connected to a lower surface of the first metal 340a, and an upper surface of the second metal 350a is connected to the other end of the power line 370a. One end of the power line 360a is connected to a lower surface of the second metal 350a, and the other end of the power line 360a is connected to a dummy area 323a of the semiconductor substrate 320a.

According to an example embodiment of the inventive concept, a space from a position spaced apart from the power TSV 310a by a first distance DIST1 to the active zone 321a on the semiconductor substrate 320a is set or reserved as an element area. According to an example embodiment of the inventive concept, the element area is an area in which semiconductor elements relatively less sensitive to changes in electrical characteristics are positioned in an area included in the keep-out zone KOZ.

According to an example embodiment of the inventive concept, the dummy area 323a is formed at a position included in the element area and spaced apart from the power TSV 310a by the first distance DIST1. According to an example embodiment of the inventive concept, a circuit or a wiring is positioned in the dummy area 323a. According to an example embodiment of the inventive concept, a power capacitor that is relatively insensitive to changes in electrical characteristics due to thermal expansion of a TSV is positioned in the dummy area 323a. A power line 360a is connected to the dummy area 323a.

According to the example embodiment of the inventive concept, as power is supplied to the first metal 340a, power may be supplied to the power capacitor positioned in the dummy area 323a. In an example embodiment, the power may be a direct current power source. According to the example embodiment of the inventive concept, because the power capacitor only needs to store power (i.e., stores only the amount of power), the importance of signal integrity may be relatively low. Accordingly, the first distance DIST1, which is a separation distance between the dummy area 323a and the power TSV 310a, may be relatively short. Accordingly, the power capacitor may be disposed at a position where the distance between the dummy area 323a and the power TSV 310a becomes the minimum allowed by the process, and accordingly, the reuse space of the keep-out zone KOZ may increase. In addition, as the total power capacitance increases, the semiconductor device may be more robust against noise.

In addition, according to an example embodiment of the inventive concept, the power capacitor is not directly connected to the power TSV 310a.

Figure 5:
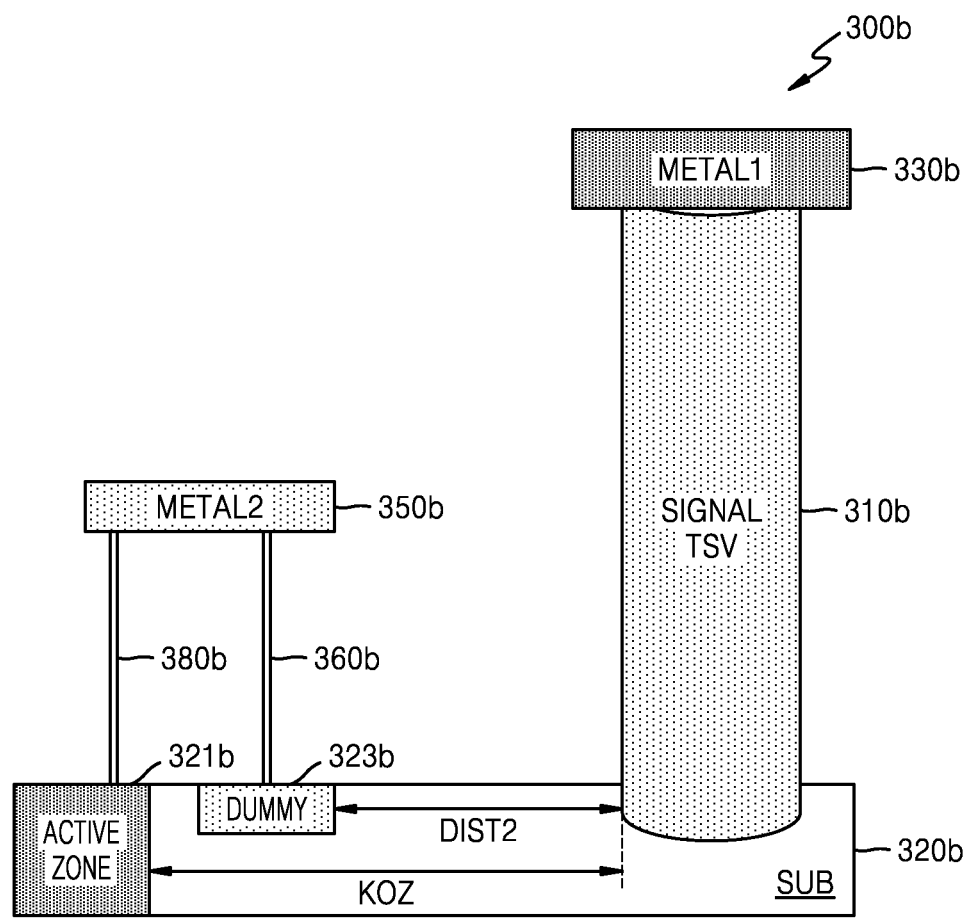
FIG. 5 is a front view showing an arrangement of a semiconductor substrate and a TSV according to an example embodiment of the inventive concept.

FIG. 5 is a front view illustrating an arrangement of a semiconductor substrate 320b and a TSV 310b according to an example embodiment of the inventive concept. FIG. 5 shows a case in which the TSV is a signal TSV 310b is transmitting a signal.

Referring to FIG. 5, the semiconductor device 300b include a semiconductor substrate 320b, the signal TSV 310b, a first metal 330b, a second metal 350b, and signal lines 360b and 380b.

The semiconductor substrate SUB 320b may include an active zone 321b corresponding to a part of the circuit block of FIG. 3 and capable of functioning as a part of a circuit by forming a channel. In an embodiment, a keep-out zone KOZ is set by a distance from the signal TSV 310b on the semiconductor substrate SUB 320b to the active zone 321b.

The signal TSV 310b passes through (or penetrates) the semiconductor substrate 320b and may be formed in a direction perpendicular to the semiconductor substrate 320b. The first metal 330b is connected to the upper surface of the signal TSV 310b.

One end of the signal lines 360b and 380b is respectively connected to a lower surface of the second metal 350b, the other end of the signal line 360b is connected to the semiconductor substrate 320b (that is, the dummy area 323b), and the other end of the signal line 380b is connected to the active zone 321b, thereby configuring one circuit. That is, the dummy area 323b may be connected to the active zone 321b through the signal lines 360b and 380b and the second metal 350b to form one circuit.

According to an example embodiment of the inventive concept, a space from a position spaced apart from the signal TSV 310b by a second distance DIST2 to the active zone 321b on the semiconductor substrate 320b may be set as or reserved as an element area.

According to an example embodiment of the inventive concept, the dummy area 323b is formed at a position included in the element area and spaced apart from the TSV by the second distance DIST2. According to an example embodiment of the inventive concept, a circuit or a wire is positioned in the dummy area 323b. According to an example embodiment of the inventive concept, a MOS capacitor and/or an active resistor relatively insensitive to changes in electrical characteristics due to thermal expansion of TSV is positioned in the dummy area 323b. The signal line 360b is connected to the dummy area 323b.

According to an example embodiment of the inventive concept, as a signal for driving a semiconductor device may be supplied to the second metal 350b, the signal may be supplied to the MOS capacitor and/or the active resistor positioned in the dummy area 323b. Because the MOS capacitor may be modeled as a power storage element and the active resistor may be modeled as a resistance element, the dummy area 323b may provide resistive R and capacitive C elements.

According to an example embodiment of the inventive concept, because the MOS capacitor C or the active resistor R may depend on a duty ratio of the input signal or a peak-to-peak magnitude of the signal waveform, the importance of signal integrity may be relatively high. Accordingly, the second distance DIST2, which is a separation distance between the dummy area 323b and the signal TSV 310b, may be relatively longer than the first distance DIST1.

Further, according to an example embodiment of the inventive concept, the MOS capacitor or the active resistor is not directly connected to the signal TSV 310b.

Figure 6:
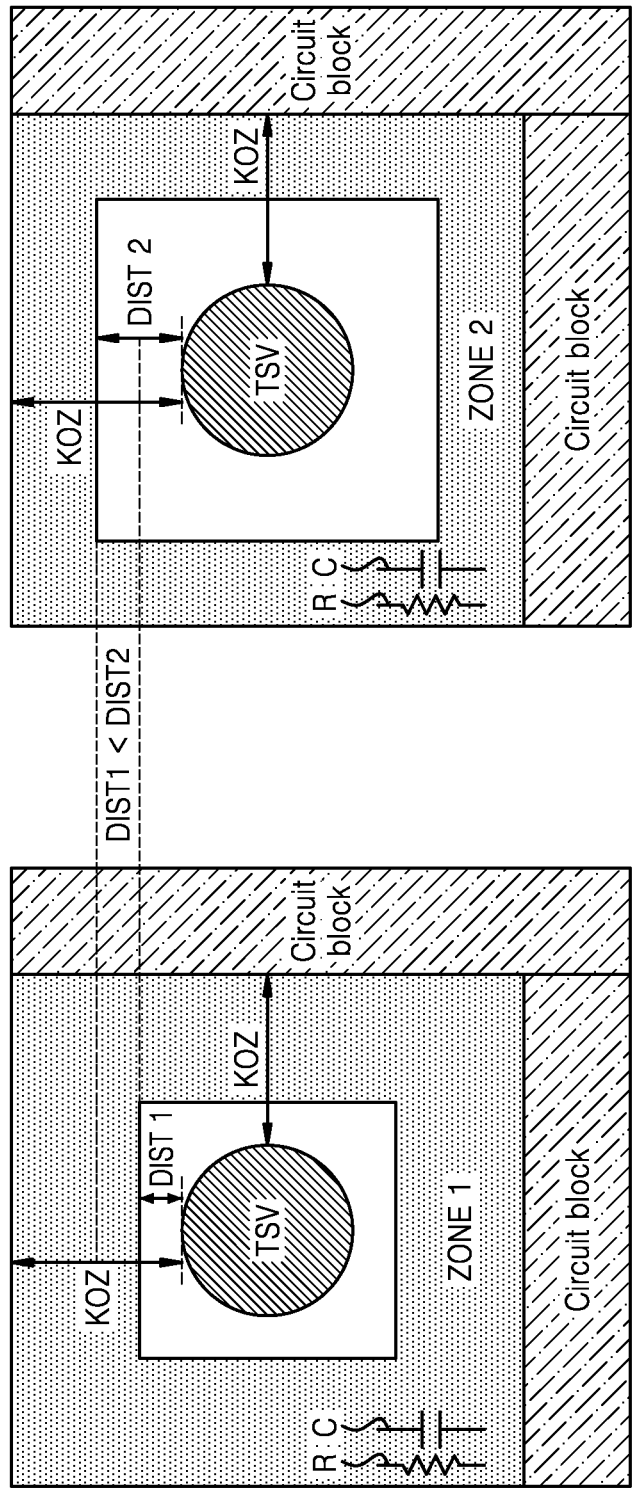
FIG. 6 is a top view comparing arrangements of a semiconductor substrate and a TSV according to an example embodiment of the inventive concept.

FIG. 6 is a top view comparing arrangements of a semiconductor substrate and a TSV according to an example embodiment of the inventive concept. FIG. 6 is a view comparing FIG. 4 with FIG. 5.

According to an example embodiment of the inventive concept, because the power capacitor stores only an amount of power, the importance of signal integrity may be relatively low, and even if the power capacitor is close to TSV, the effect may be relatively small. Accordingly, the first distance DIST1 separated from the TSV may be relatively short.

According to an example embodiment of the inventive concept, because the MOS capacitor C or the active resistor R may depend on a duty ratio of the input signal or a peak-to-peak magnitude of the signal waveform, the importance of signal integrity may be relatively high. Accordingly, in an exemplary embodiment, the second distance DIST2, which is a separation distance between the dummy area 323b and the signal TSV 310b, is relatively longer than the first distance DIST1 (DIST1<DIST2).

Figure 7:
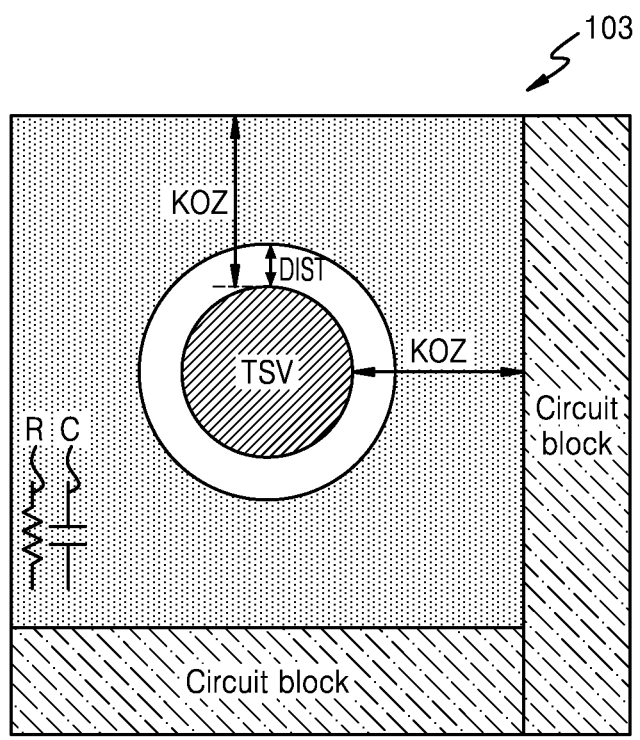
FIG. 7 is a top view comparing arrangements of a semiconductor substrate and a TSV according to an example embodiment of the inventive concept.

FIG. 7 is a top view comparing arrangements of a semiconductor substrate and a TSV according to an example embodiment of the inventive concept.

In an example embodiment, the keep-out zone KOZ is an area in which carrier mobility or ion activity falls by a certain value (e.g., 5%) or more. As described above, a semiconductor element in the keep-out zone KOZ may have poor electrical characteristics.

According to an example embodiment of the inventive concept, the keep-out zone KOZ is a space from the outermost portion of a cylindrical TSV to a circuit block that is a circuit area for driving a semiconductor device. In other words, the keep-out zone KOZ may be a boundary from a circle, which is a shape of the TSV, to a square, which is a circuit block largely surrounding the TSV.

FIG. 7 is compared with FIG. 3 below. Referring to FIG. 7, the inside of an element area formed by a predetermined separation distance DIST from the TSV is circular. Compared with FIG. 7, FIG. 3 shows that the distance to the TSV is a predetermined separation distance DIST horizontally and vertically, but the diagonal portion is not secured as an element area even though the diagonal is greater than the separation distance DIST.

Referring again to FIG. 7, the element area may be wider than that of FIG. 3 by maintaining a uniform separation distance DIST from the outer circle of TSV, and the degree of integration of the semiconductor device or the utilization rate of the keep-out zone KOZ may increase.

Figure 8A:
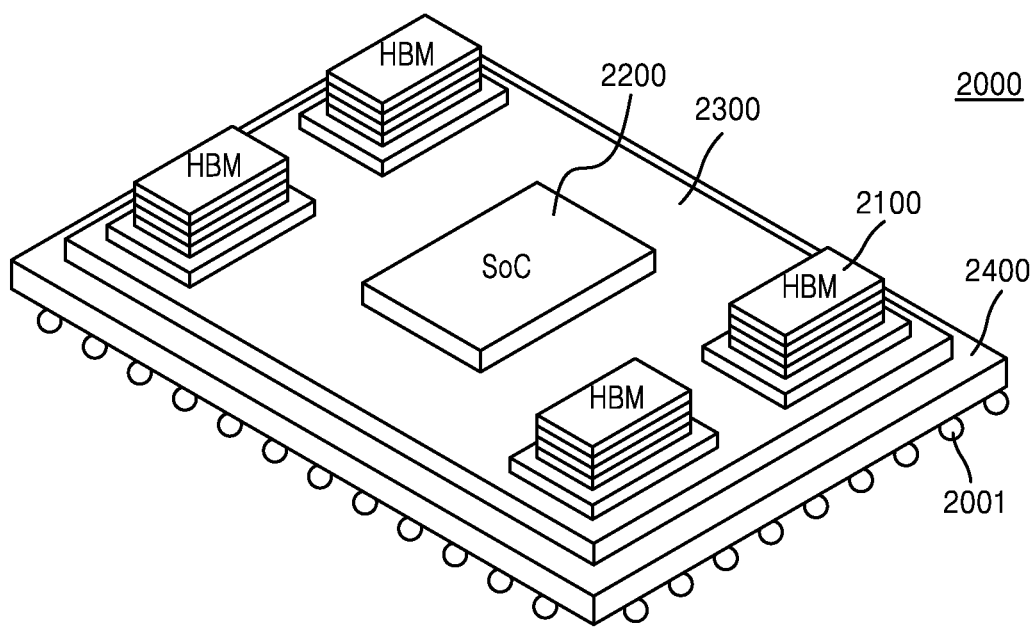
FIGS. 8A and 8B are diagrams illustrating an implementation example of a semiconductor package according to example embodiments of the inventive concept.
Figure 8B:
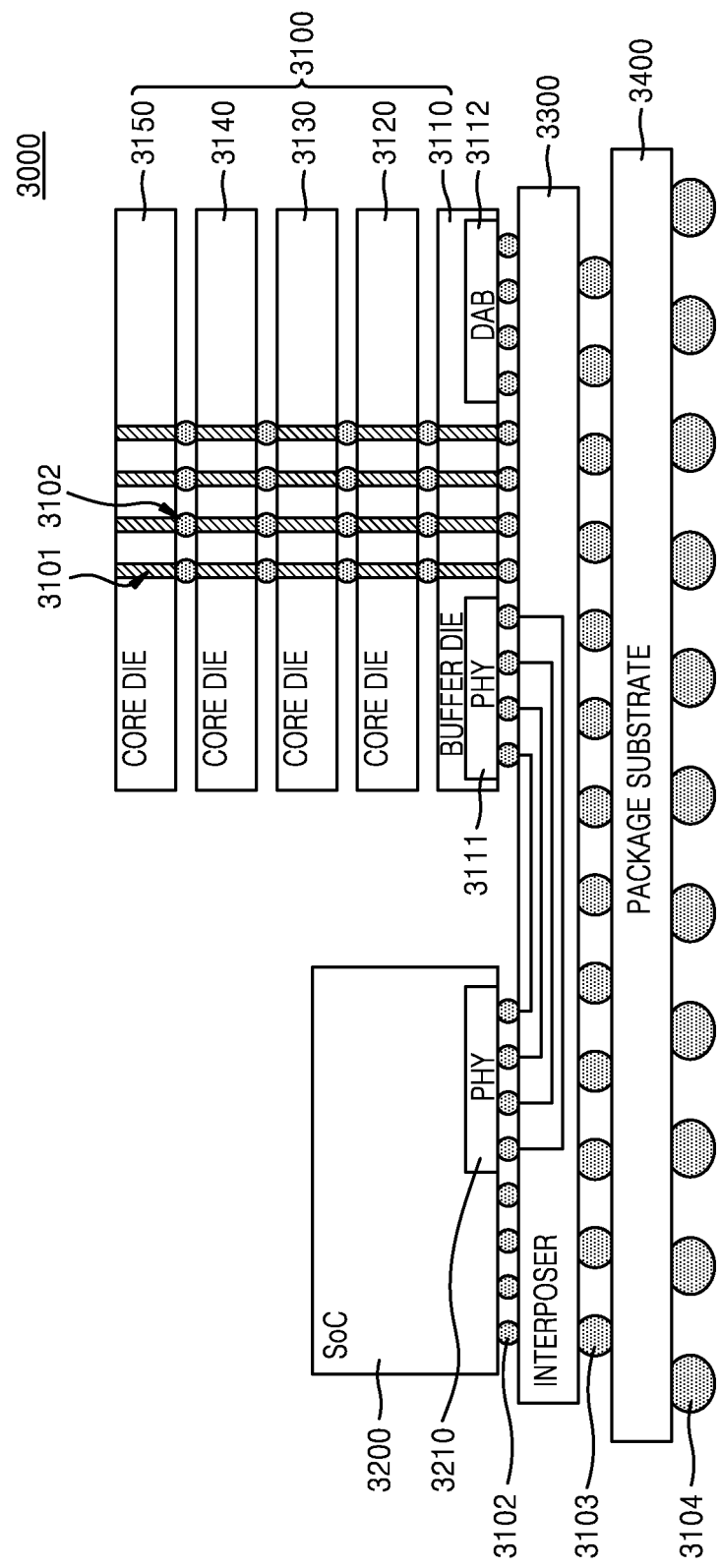
Figure 8C:
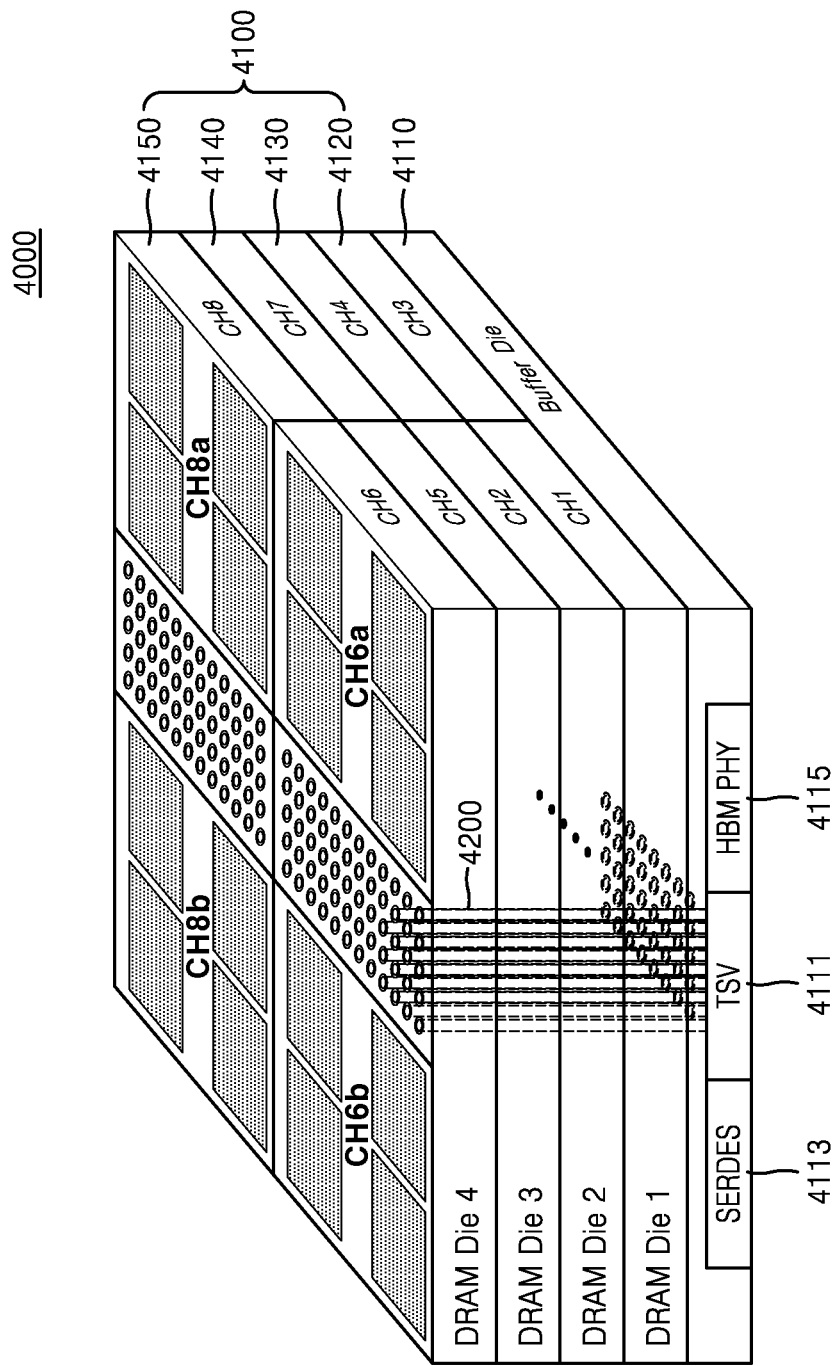
FIG. 8C is a diagram illustrating a memory device according to example embodiments of the inventive concept.

FIGS. 8A and 8B are diagrams illustrating example implementations of semiconductor packages 2000 and 3000 according to an example embodiment of the inventive concept, and FIG. 8C is a diagram illustrating a memory device 4000 according to an embodiment of the present invention.

Referring to FIG. 8A, the semiconductor package 2000 includes a plurality of stacked memory devices 2100 and a system-on-chip 2200. The stacked memory devices 2100 and the system-on-chip 2200 may be stacked on an interposer 2300, and the interposer 2300 may be stacked on a package substrate 2400. The semiconductor package 2000 may transmit and receive signals to and from other external packages or semiconductor devices through a solder ball 2001 attached to the lower part the package substrate 2400.

Each of the stacked memory devices 2100 may be implemented based on a High Bandwidth Memory (HBM) standard. However, the inventive concept is not limited thereto, and each of the stacked memory devices 2100 may be implemented based on graphics double data rate (GDDR), High Bandwidth Cache (HMC), or Wide I/O standards.

The system-on-chip 2200 may include at least one processor such as a CPU, an application processor (AP), a graphical processing unit (GPU), and a neural network processing unit (NPU), and a plurality of memory controllers for controlling the plurality of stacked memory devices 2100. The system-on-chip 2200 may transmit and receive signals to and from a corresponding stacked memory device through the memory controller.

Referring to FIG. 8B, the semiconductor package 3000 includes a stacked memory device 3100, a system-on-chip 3200, an interposer 3300, and a package substrate 3400. The stacked memory device 3100 may include a buffer die 3110 and core dies 3120 to 3150.

Each of the core dies 3120 to 3150 may include memory cells for storing data. The buffer die 3110 may include a physical layer 3111 and a direct access area (DAB) 3112. The physical layer 3111 may be electrically connected to a physical layer 3210 of the system-on-chip 3200 through the interposer 3300. The stacked memory device 3100 may receive signals from the system-on-chip 3200 through the physical layer 3111 or transmit signals to the system-on-chip 3200 through the physical layer 3111.

The direct access area 3112 may provide an access path through which the stacked memory device 3100 may be tested without passing through the system-on-chip 3200. The direct access area 3112 may include conductive means (e.g., ports or pins) capable of direct communication with an external test device. The test signal received through the direct access area 3112 may be transmitted to the core dies 3120 to 3150 through TSVs. Data read from the core dies 3120 to 3150 for testing the core dies 3120 to 3150 may be transmitted to the test device through the TSVs and the direct access area 3112. Accordingly, a direct access test for the core dies 3120 to 3150 may be performed.

The buffer die 3110 and the core dies 3120 to 3150 may be electrically connected to each other through TSVs 3101 and bumps 3102. The buffer die 3110 may receive signals provided to each channel from the system-on-chip 3200 through the bumps 3102 allocated for each channel, or transmit signals to the system-on-chip 3200 through the bumps 3102. For example, the bumps 3102 may be micro bumps.

The system-on-chip 3200 may execute applications supported by the semiconductor package 3000 using the stacked memory device 3100. For example, the system-on-chip 3200 may include at least one processor among a central processing unit (CPU), an application processor (AP), a graphics processing unit (GPU), a neural processing unit (NPU), a tensor processing unit (TPU), a vision processing unit (VPU), an image signal processor (ISP), and a digital signal processor (DSP) to execute specialized operations.

The system-on-chip 3200 may control the overall operation of the stacked memory device 3100. The system-on-chip 3200 may correspond to the memory controller 200 of FIG. 1. The system-on-chip 3200 may include a physical layer 3210. The physical layer 3210 may include an interface circuit for transmitting and receiving signals to and from the physical layer 3111 of the stacked memory device 3100. The system-on-chip 3200 may provide various signals to the physical layer 3111 through the physical layer 3210. Signals provided to the physical layer 3111 may be transmitted to the core dies 3120 to 3150 through an interface circuit of the physical layer 3111 and the TSVs 3101.

The interposer 3300 may connect the stacked memory device 3100 to the system-on-chip 3200. The interposer 3300 may connect the physical layer 3111 of the stacked memory device 3100 to the physical layer 3210 of the system-on-chip 3200 and provide physical paths formed using conductive materials. Accordingly, the stacked memory device 3100 and the system-on-chip 3200 may be stacked on the interposer 3300 to transmit and receive signals with each other.

Bumps 3103 may be attached to the upper part of the package substrate 3400, and solder balls 3104 may be attached to the lower part of the package substrate 3400. For example, the bumps 3103 may be flip-chip bumps. The interposer 3300 may be stacked on the package substrate 3400 through the bumps 3103. The semiconductor package 3000 may transmit and receive signals to and from other external packages or semiconductor devices through the solder balls 3104. For example, the package substrate 3400 may be a printed circuit board (PCB).

Referring to FIG. 8C, the memory device 4000 may be a high bandwidth memory (HBM) including a plurality of channels CH1 to CH8 having interfaces that are independent from each other. The memory device 4000 may include a plurality of dies, and may include a buffer die 4110 and at least one DRAM die 4100 stacked on the buffer die 4110. For example, the first DRAM die 4120 may include a first channel CH1 and a third channel CH3, the second DRAM die 4130 may include a second channel CH2 and a fourth channel CH4, the third DRAM die 4140 may include a fifth channel CH5 and a seventh channel CH7, and the fourth DRAM die 4150 may include a sixth channel CH6 and an eighth channel CH8.

The buffer die 4110 may communicate with a CPU 210 through conductive means formed on the outer surface of the memory device 4000, such as bumps or solder balls. The buffer die 4110 may receive commands, addresses, and data from the CPU 210, and may provide the received commands, addresses and data to at least one channel of the DRAM die 4100. In addition, the buffer die 4110 may provide data output from a channel of at least one DRAM die 4100 to the CPU 210.

The memory device 4000 may include a plurality of through silicon vias TSVs 4200 passing through the DRAM dies 4120 to 4150. When each of the channels CH1 to CH8 has a bandwidth of 128 bits, the TSVs 4200 may include elements for input/output of 1024 bits of data. Each of the channels CH1 to CH8 may be separated and disposed left and right. For example, in the fourth DRAM die 4150, the sixth channel CH6 may be divided into pseudo channels CH6a and CH6b, and the eighth channel CH8 may be divided into pseudo channels CH8a and CH8b. The TSVs 4200 may be positioned between the pseudo channels CH6a and CH6b of the sixth channel CH6 and between the pseudo channels CH8a to CH8b of the eighth channel CH8.

The buffer die 4110 may include a TSV area 4111, a serializer/deserializer SERDES area 4113, and an HBM physical layer interface, that is, an HBM PHY area 4115. The TSV area 4111 is an area in which the TSV 4200 is formed for communication with at least one DRAM die 4100.

The SERDES area 4113 is an area that provides a SERDES interface of the Joint Electron Device Engineering Council (JEDEC) standard as the processing throughput of the CPU 210 increases and as demands for memory bandwidth increase. The SERDES area 4113 may include a SERDES transmitter part, a SERDES receiver part, and a controller part. The SERDES transmitter part may include a parallel-to-serial circuit and a transmitter, receive a parallel data stream, and serialize the received parallel data stream. The SERDES receiver part may include a receiver, an amplifier, equalizer, clock and data recovery (CDR) circuit, and a serial-to-parallel circuit. The serial-to-parallel circuit may receive a serial data stream, and parallelize the received serial data stream. The controller part includes an error detection circuit, an error correction circuit, and registers such as a First In First Out (FIFO).

The HBM PHY area 4115 may include a physical or electrical layer and a logical layer provided for signals, frequency, timing, driving, detailed operating parameters and functionality required for efficient communication between the CPU 210 and the memory device 4000. The HBM PHY area 4115 may perform memory interfacing such as selecting a row and column corresponding to a memory cell, writing data to a memory cell, or reading written data. The HBM PHY area 4115 may support features of the HBM protocol of the JEDEC standard. For example, the HBM PHY area 4115 may perform data communication of a 64-bit size with the CPU 210.

Figure 9:
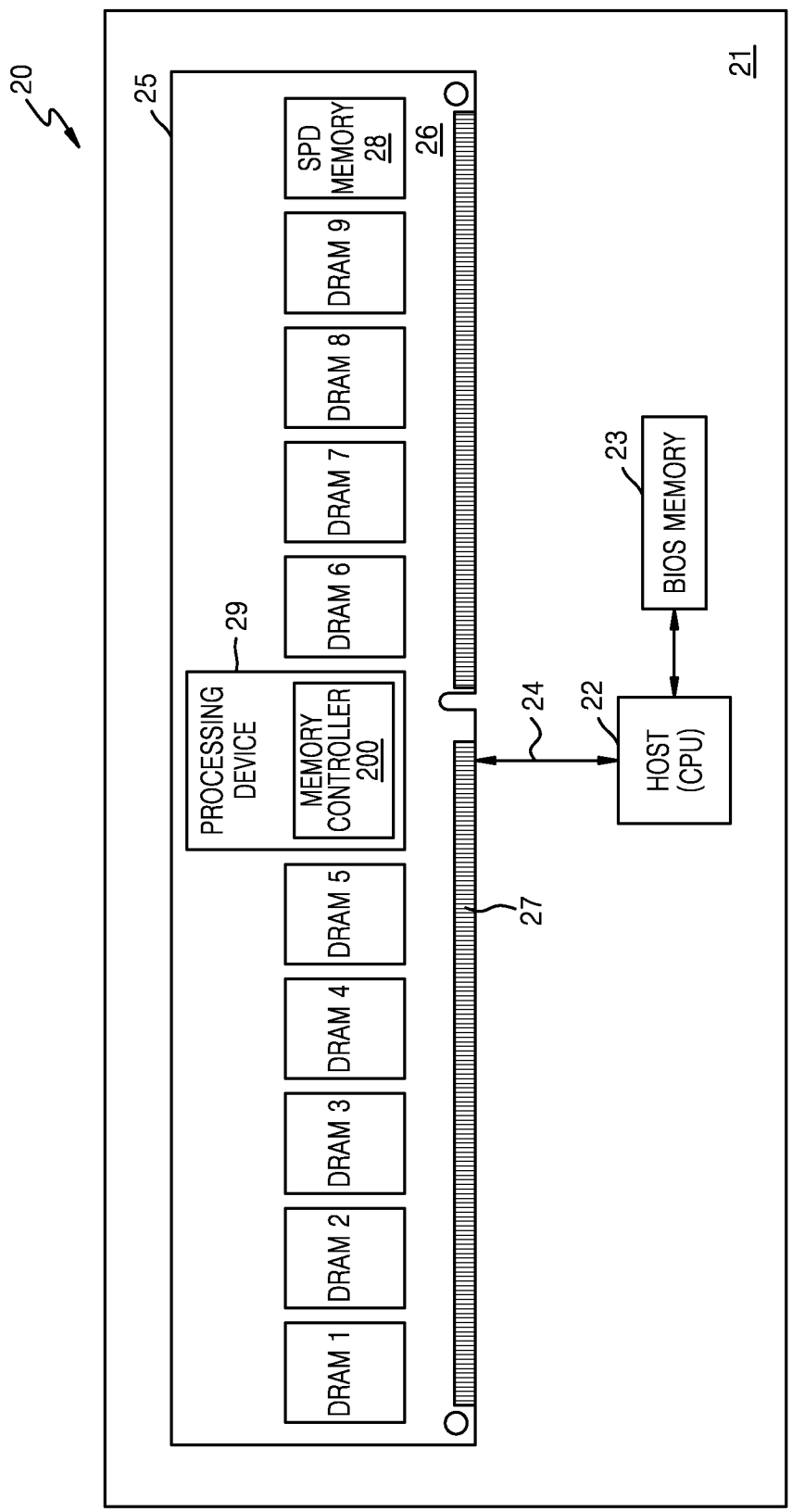
FIG. 9 is a block diagram conceptually illustrating a computing system including a memory module in which a processing device is mounted according to an example embodiment of the inventive concept.

FIG. 9 is a block diagram conceptually illustrating a computing system 20 including a memory module 25 on which a processing device 29 is mounted according to an example embodiment of the inventive concept.

Referring to FIG. 9, the computing system 20 include a host device 22 mounted on a board 21, the memory module 25, and a basic input/output system (BIOS) memory 23. The host device 22 may be communicatively connected to the memory module 25 through a memory bus 24.

Some examples may be described using the expressions "connected" and/or "coupled" together with their derivatives. These terms are not necessarily intended as synonyms for each other. For example, a description using the terms "connected" and/or "coupled" may indicate that two or more elements are in direct physical or electrical contact with each other. In addition, the terms "connecting" and/or "coupled" may also mean that two or more elements are not in direct contact with each other but still cooperate or interact with each other.

The host device 22 may be, for example, a computing device such as a laptop computer, a desktop computer, a server computer, a workstation, a portable communication terminal, a personal digital assistant (PDA), a portable multimedia player (PMP), a smart phone, a tablet PC, and other suitable computers, or a virtual machine, or a virtual computing device thereof. Alternatively, the host device 22 may be some of the components included in the computing system 20 such as a graphics card.

The host device 22 may be a functional block that performs general computing operations in the computing system 20, and may correspond to a central processing unit (CPU), a digital signal processor (DSP), or an application processor (AP). In this specification, the host device 22 may be referred to as a CPU 22.

The CPU 22 may be configured to execute one or more machine-executable instructions or software, firmware, or pieces of combinations thereof. The CPU 22 may include any number of processor cores. For example, the CPU 22 may include a single-core or a multi-core such as a dual-core, a quad-core, and a hexa-core. Although the computing system 20 including one CPU 22 is shown in FIG. 9, according to an embodiment, the computing system 20 may include a plurality of CPUs. The CPU 22 may be connected to a BIOS memory 23 through various interfaces such as a serial peripheral interface (SPI) or a low pin count (LPC) bus.

The BIOS memory 23 may store a BIOS code for booting the computing system 20. The BIOS memory 23 may be implemented as a nonvolatile memory device. The nonvolatile memory device may be implemented as an Electrically Erasable Programmable Read-Only Memory (EEPROM), Flash Memory, Resistive RAM (RRAM), Magnetic RAM (MRAM), Phase change RAM (PRAM), Ferroelectric RAM (FRAM), Nano Floating Gate Memory (NFGM), Polymer RAM (PoRAM), or similar memory.

The BIOS code is a POST code and/or a part of POST code for detecting hardware of the computing system 20 such as the board 21, the memory module 25, a keyboard, or a disk drive, and checking whether the hardware is operating normally. The BIOS code may include a memory reference code (MRC) for initializing the memory module 25. The MRC may include various algorithms configured to allow the CPU 22 to normally interoperate with the memory module 25.

By the MRC executed by the CPU 22, Serial Presence Detect (SPD) data stored in an SPD memory device 28 of the memory module 25 may be read through the memory bus 24, and frequency, timing, driving, and detailed operation parameter for controlling the memory module 25 may be set using the SPD data. The SPD data may include the type of the memory module 25, the type of the memory device included in the memory module 25, operation timing information, manufacturing information, a revision code, and a serial number. A built-in self-test (BIST) and/or memory training of the memory module 25 may be performed by the MRC code.

The memory bus 24 is shown as one signal line through which the CPU 22 is connected to the connecting pins 27 of the memory module 25 for the sake of brevity, but in practice, the memory bus 24 may be a plurality of signal lines. The memory bus 24 may be implemented as one channel including a plurality of signal lines, or may be implemented as a plurality of channels. In addition, one or more memory modules 25 may be connected to each channel.

The memory bus 24 may include command/address signal lines for transmitting command/addresses and data lines for transmitting data. In addition, the memory bus 24 may include a module ready signal (i.e., RDY_DIMM) line transmitted from the memory module 25 to the CPU 22. The module ready signal RDY_DIMM is a signal indicating that memory training by the processing device 29 is completed after memory training has been performed between the processing device 29 and the memory devices DRAM1-DRAM9 in the memory module 25 during the booting operation of the computing system 20. The module ready signal RDY_DIMM may be a basic signal indicating that memory devices DRAM1 to DRAM9 are ready to perform secondary memory training by the CPU 22 after primary memory training by the processing device 29 of the memory module 25 has been performed.

The memory module 25 may be configured to perform a processing function, and include the processing device 29 coupled to the printed circuit board 26, the plurality of memory devices DRAM1 to DRAM9, and the SPD memory device 28. The memory module 25 may be implemented as any type of memory module. For example, the memory module 25 may be implemented as a registered DIMM (RDIMM), a load reduced DIMM (LRDIMM), a fully buffered DIMM (FBDIMM), or a small outline DIMM (SODIMM).

The processing device 29 may operate as an accelerator or a co-processor for the CPU 22. The processing device 29 may be implemented as a system-on-chip (SoC) in which various functional blocks and/or a plurality of intellectual properties (IPs) are integrated into one semiconductor integrated circuit. The intellectual property (IP) refers to circuits, logic, or combinations of these that may be integrated into the SoC.

The processing device 29 may be an accelerator that specializes in performing certain functions of the CPU 22, and include a graphic processing unit (GPU) that is a functional block that specializes in processing graphics data, a neural processing unit (NPU) that is a block that specializes in artificial intelligence (AI) computation and inference, and/or a data processing unit (DPU) that is a block specialized in data transmission.

The processing device 29 may include a memory controller 200 that controls data transmission/reception to/from the memory devices DRAM1 to DRAM9. The memory controller 200 may access the memory devices DRAM1 to DRAM9 in response to a memory request from the processing device 29. According to an embodiment, the memory controller 200 may access the memory devices DRAM1 to DRAM9 according to a memory request from the CPU 22. In this case, the memory controller 200 may be configured to transparently perform access of the memory devices DRAM1 to DRAM9 controlled by the CPU 22 to the processing device 29.

The memory controller 200 may include a memory physical layer interface for interfacing with memory devices DRAM1 to DRAM9 such as selecting a row and column corresponding to a memory location, writing data to a memory location, or reading written data. Typically, the memory physical layer interface is referred to as the memory PHY.

The memory devices DRAM1 to DRAM9 may write data or read data through the control of the memory controller 200 in the processing device 29. For example, the memory devices DRAM1 to DRAM9 may be DRAM devices.

Figure 10:
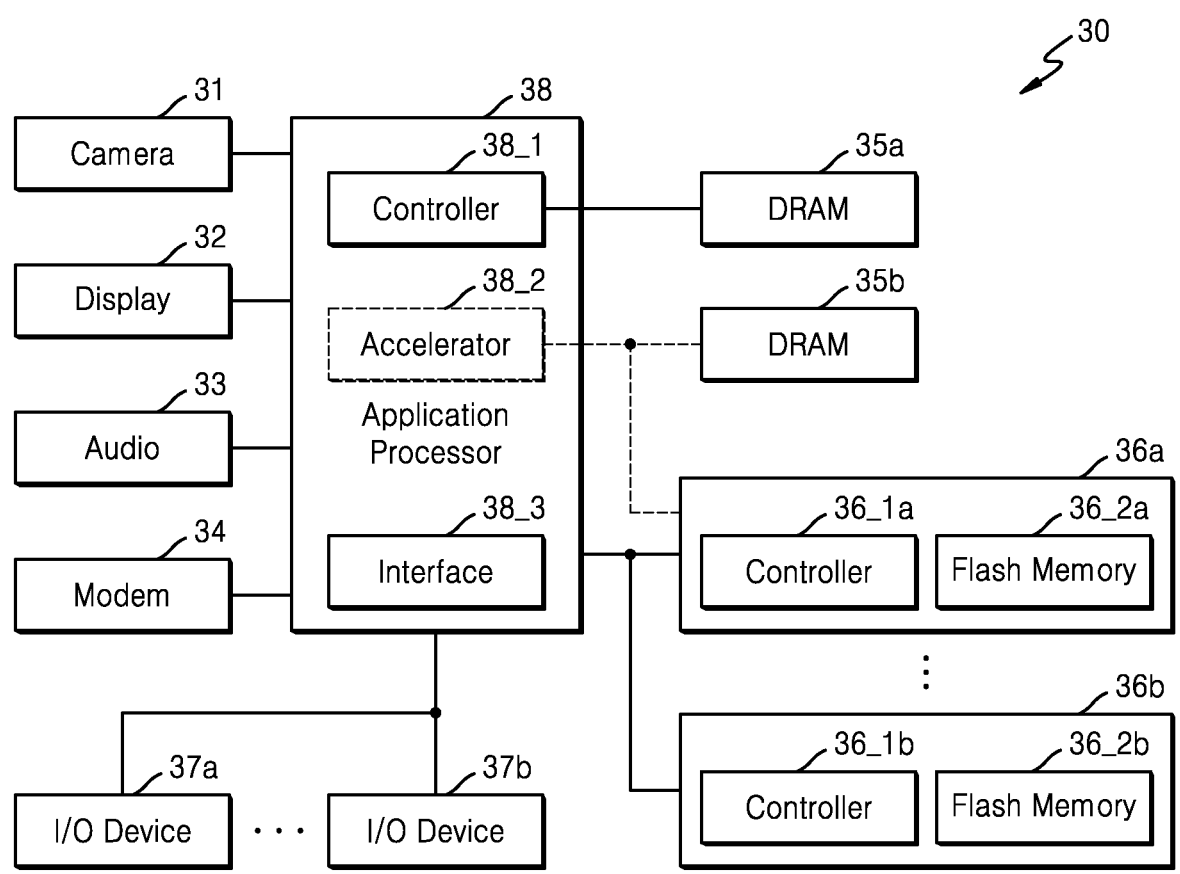
FIG. 10 is a block diagram of a system to which a memory device according to an example embodiment of the inventive concept is applied.

FIG. 10 is a block diagram illustrating a system 30 to which the memory devices 35a and 35b according to an example embodiment of the inventive concept are applied.

Referring to FIG. 10, the system 30 includes a camera 31, a display 32, an audio processing unit 33, a modem 34, DRAMs 35a and 35b, flash memories 36a and 36b, I/O devices 37a and 37b, and an application processor 38 (hereinafter referred to as "AP"). The system 30 is implemented as a laptop computer, mobile phone, smart phone, tablet personal computer (PC), wearable device, healthcare device, or internet of things (TOT) device. In addition, the system 30 may be implemented as a server or a personal computer.

The camera 31 may capture a still image or a moving image through the user's control, and may store the captured still image/moving image data or transmit the captured image/video data to the display 32. The audio processing unit 33 may process audio data included in the flash memories 36a and 36b or network content. The modem 34 modulates and transmits a signal to transmit/receive wired/wireless data, and demodulates the modulated signal to restore the original signal at the receiving side. I/O devices 37a and 37b may include devices that provide digital input and/or output functions, such as a universal serial bus (USB), storage, a digital camera, a secure digital (SD) card, a digital versatile disc (DVD), a network adapter, or a touch screen.

The AP 38 may control the overall operation of the system 30. The AP 38 may control the display 32 so that a part of the content stored in the flash memories 36a and 36b is displayed on the display 32. When a user input is received through the I/O devices 37a and 37b, the AP 38 may perform a control operation corresponding to the user input. The AP 38 may include an accelerator block, which is a dedicated circuit for calculating AI data, or may include an accelerator chip 38_2 separate from the AP 38. The DRAM 35b may be additionally mounted on the accelerator block or the accelerator chip 38_2. The accelerator is a function block that specializes in performing a certain function of the AP 38, and may include a Graphic Processing Unit (GPU), which is a functional block that specializes in processing graphics data, a Neural Processing Unit (NPU), a block specialized for performing AI calculations and inference, and a Data Processing Unit (DPU), a block specialized for transmitting data.

The system 30 may include a plurality of DRAMs 35a and 35b. The AP 38 may control the DRAMs 35a and 35b through command and mode register (MRS) setting conforming to the joint electron device engineering council (JEDEC) standard, or may communicate by setting a DRAM interface protocol in order to use a company-specific function such as low voltage/high speed/reliability and a cyclic redundancy check (CRC)/error correction code (ECC) function. For example, the AP 38 may communicate with the DRAM 35a through an interface conforming to JEDEC standards such as low power double data rate 4 (LPDDR4) and low power double data rate 5 (LPDDR5), and the accelerator block or the accelerator chip 38_2 may communicate by setting a new DRAM interface protocol in order to control the accelerator DRAM 35b having a higher bandwidth than the DRAM 35a.

In FIG. 10, only the DRAMs 35a and 35b are shown, but the inventive concept is not limited thereto. Any memory such as PRAM, SRAM, MRAM, RRAM, FRAM, or Hybrid RAM memory may be used as long as the bandwidth, response speed, and voltage conditions of the AP 38 or the accelerator chip 38_2 are satisfied. The DRAMs 35a and 35b have relatively smaller latency and bandwidth than the I/O devices 37a and 37b or the flash memories 36a and 36b. The DRAMs 35a and 35b may be initialized when the system 30 is powered on, and may be loaded with an operating system and application data and used as a temporary storage location for the operating system and application data, or may be used as an execution space for various software codes.

In the DRAMs 35a and 35b, add/subtract/multiply/divide operations, vector operations, address operations, or Fast Fourier Transform (FFT) operations may be performed. In addition, in the DRAMs 35a and 35b, a function for execution used for inference may be performed. Here, the inference may be performed in a deep learning algorithm using an artificial neural network. The deep learning algorithm may include training for learning a model (e.g., a machine learning model) through various data and an inference for recognizing data with the trained model. As an embodiment, the image captured by the user through the camera 31 may be a signal-processed and stored in the DRAM 35b, and the accelerator block or the accelerator chip 38_2 may perform an AI data operation that recognizes data by using data stored in the DRAM 35b and a function used for inference. The DRAMs 35a and 35b may be the same as or similar to the memory device 100 illustrated in FIGS. 1 to 8. The memory device 100 may divide a memory cell array 110 including a plurality of memory cells into a plurality of areas, and include PBT circuits that perform a parallel bit test (PBT) on a plurality of memory cells. The PBT circuits may specify a bad data bit among data output from a plurality of areas of the PBT, and provide the specified bad data bit to the memory controller 200. The memory controller 110 may include an ECC engine that corrects and detects an error in data read from the memory devices 100, and may correct a specified bad data bit using the ECC engine. The ECC engine may generate an ECC codeword for correcting a specified bad data bit. The memory controller 200 may control the memory device 100 to write an ECC codeword to memory cells including bad memory cells having bad data bits.

The system 30 may include a plurality of storages or a plurality of flash memories 36a and 36b having a capacity greater than capacity of the DRAMs 35a and 35b. The accelerator block or the accelerator chip 38_2 may perform a training step and an AI data operation using the flash memories 36a and 36b. In one embodiment, the flash memories 36a and 36b may more efficiently perform a training step and an inference AI data operation performed by the AP 38 and/or the accelerator chip 38_2 using a computing device provided in the memory controller 1610. The flash memories 36a and 36b may store pictures taken through the camera 31 or may store data transmitted through a data network. For example, augmented reality/virtual reality, high definition (HD), or ultra high definition (UHD) content may be captured and stored by the camera.

While the inventive concept has been particularly shown and described with reference to embodiments thereof, it will be understood that various changes in form and details may be made therein without departing from the spirit and scope of the disclosure.

What is claimed is:

1. A semiconductor device comprising:
a semiconductor structure comprising a semiconductor substrate including an active zone having a channel;
a through silicon via (TSV) structure including a power TSV configured to transmit power and a signal TSV configured to transmit a signal, the TSV structure penetrating the semiconductor substrate; and
power and signal keep-out zones each located a predetermined distance away from the TSV structure and bounded by the active zone to prevent deterioration of electrical characteristics,
wherein the power keep-out zone includes a first element area located a first distance away from the power TSV that includes a circuit,
wherein the signal keep-out zone includes a second element area located a second distance away from the signal TSV that includes a circuit, and
wherein the second distance is longer than the first distance.

2. The semiconductor device of claim 1, wherein the first element area or the second element area includes at least one of a resistance element and a power storage element.

3. The semiconductor device of claim 1, wherein the first element area includes a power capacitor that increases a total power capacitance of the semiconductor substrate.

4. The semiconductor device of claim 3, wherein an upper surface of the power TSV is connected to a first metal layer, and the first element area is connected to a second metal layer that is not connected to the first metal layer through a power line.

5. The semiconductor device of claim 1, wherein the second element area includes at least one resistance element and at least one power storage element.

6. The semiconductor device of claim 5, wherein the at least one resistance element includes an active resistor including a transistor, and the at least one power storage element includes a metal oxide semiconductor (MOS) capacitor.

7. The semiconductor device of claim 1, wherein the second element area is connected to a third metal layer through a first signal line, and the third metal layer is connected to the active zone through a second signal line.

8. The semiconductor device of claim 1, wherein the electrical characteristics deterioration is determined when a carrier mobility of an active silicon is reduced by 5% or 10%.

9. The semiconductor device of claim 1, wherein a first semiconductor element included in the first element area or the second element area is less sensitive to deterioration of the electrical characteristics than a second semiconductor device included in the active zone.

10. The semiconductor device of claim 1, wherein a length of each of the power and signal keep-out zones is 6 microns or less.

11. A semiconductor device comprising:
a semiconductor substrate;
a through silicon via (TSV) structure configured to penetrate the semiconductor substrate, the TSV structure including a power TSV and a signal TSV;
a first power metal layer connected to an upper portion of the power TSV and configured to supply power;
a first signal metal layer connected to an upper portion of the signal TSV and configured to supply a signal;
an active zone included in the semiconductor substrate, wherein the active zone includes a channel;
a keep-out zone perpendicular to a direction in which the TSV structure is formed and bordering from the TSV structure to the active zone, the keep-out zone comprising power and signal keep-out zones;

a first element area included in the power keep-out zone; and a second element area included in the signal keep-out zone, wherein the first element area includes a resistance element or a power storage element, and is spaced apart from the power TSV by a first distance, wherein the second element area includes a resistance element or a power storage element, and is spaced apart from the signal TSV by a second distance longer than the first distance.

12. The semiconductor device of claim 11, wherein the resistance element is implemented as a power capacitor that increases a total power capacitance of the semiconductor substrate.

13. The semiconductor device of claim 11, further comprising:
a second power metal layer having a same composition as the first power metal layer, but separated from the first power metal layer, and configured to supply the power;
a first power line configured to connect the second power metal layer to a third power metal layer that is different from the second power metal layer; and
a second power line configured to connect the third power metal layer to the first element area.

14. The semiconductor device of claim 11, wherein the resistance element includes an active resistor including a transistor, and the power storage element includes a Metal Oxide Semiconductor (MOS) capacitor.

15. The semiconductor device of claim 11, further comprising:
a first signal line configured to connect the second element area to a second signal metal layer; and
a second signal line configured to connect the third second signal metal layer to the active zone.

16. A semiconductor device comprising:
a memory cell array including memory cells formed at intersections of a plurality of word lines and a plurality of bit lines;
a peripheral circuit providing a plurality of signals for accessing the memory cell array;
a through silicon via (TSV) area including a power TSV configured to transmit power, and a signal TSV configured to transmit a signal; and
power and signal keep-out zones located a predetermined distance away from the TSV area and bounded by an active zone to prevent deterioration of electrical characteristics,
wherein the power keep-out zone includes a first element area located a first distance away from the power TSV that includes a circuit, the signal keep-out zone includes a second element area located a second distance away from the signal TSV that includes a circuit, and
wherein the second distance is longer than the first distance.

17. The semiconductor device of claim 16, wherein the first element area includes a power capacitor that increases a total power capacitance of the semiconductor device.

18. The semiconductor device of claim 16, wherein the second element area includes at least one of an active resistor and a metal oxide semiconductor (MOS) capacitor, wherein the active resistor includes a transistor.

* * * * *